(12) United States Patent
Hobbs

(10) Patent No.: US 8,760,187 B2
(45) Date of Patent: Jun. 24, 2014

(54) THERMOCENTRIC ALIGNMENT OF ELEMENTS ON PARTS OF AN APPARATUS

(75) Inventor: Eric D. Hobbs, Livermore, CA (US)

(73) Assignee: L-3 Communications Corp., New York, NY (US)

( * ) Notice: Subject to any disclaimer, the term of this patent is extended or adjusted under 35 U.S.C. 154(b) by 902 days.

(21) Appl. No.: 12/327,576

(22) Filed: Dec. 3, 2008

(65) Prior Publication Data

US 2010/0134128 A1  Jun. 3, 2010

(51) Int. Cl.
*G01R 31/20* (2006.01)

(52) U.S. Cl.
USPC ............ 324/758.01; 324/754.01; 324/754.07; 324/754.03

(58) Field of Classification Search
USPC ...................................... 324/758.01
See application file for complete search history.

(56) References Cited

U.S. PATENT DOCUMENTS

| | | | |
|---|---|---|---|
| 3,691,506 A | 9/1972 | Bender | |
| 4,330,163 A | 5/1982 | Aikens et al. | |
| 4,715,682 A | 12/1987 | Koek et al. | |
| 4,779,463 A | 10/1988 | Woodruff | |
| 4,899,099 A * | 2/1990 | Mendenhall et al. | 324/750.23 |
| 5,422,574 A | 6/1995 | Kister | |
| 5,806,181 A | 9/1998 | Khandros et al. | |
| 6,137,296 A | 10/2000 | Yoon et al. | |
| 6,429,029 B1 | 8/2002 | Eldridge et al. | |
| 6,533,606 B2 | 3/2003 | Yamane | |
| 6,538,799 B2 | 3/2003 | McClelland | |
| 6,640,415 B2 | 11/2003 | Eslamy et al. | |
| 6,669,489 B1 | 12/2003 | Dozier, II | |
| 6,683,787 B1 | 1/2004 | Banton et al. | |
| 6,690,185 B1 | 2/2004 | Khandros et al. | |
| 6,722,905 B2 | 4/2004 | Negishi et al. | |
| 6,972,578 B2 | 12/2005 | Martens et al. | |
| 6,999,317 B2 | 2/2006 | Chengalva et al. | |
| 7,002,363 B2 | 2/2006 | Mathieu | |
| 7,064,566 B2 | 6/2006 | Khandros et al. | |
| 7,071,714 B2 | 7/2006 | Eldridge et al. | |
| 7,217,580 B2 | 5/2007 | Ondricek et al. | |

(Continued)

FOREIGN PATENT DOCUMENTS

| | | |
|---|---|---|
| JP | 2001-337131 | 12/2001 |
| JP | 2008-053741 | 3/2008 |
| KR | 10-0268414 | 11/2000 |
| KR | 10-0434790 | 2/2001 |

OTHER PUBLICATIONS

U.S. Appl. No. 12/478,117, filed Jun. 4, 2009, Breinlinger et al.

(Continued)

*Primary Examiner* — Arleen M Vazquez
*Assistant Examiner* — Alesa Allgood
(74) *Attorney, Agent, or Firm* — Kirton McConkie

(57) ABSTRACT

A first device and a second device can include at least one alignment feature and at least one corresponding constraint. The alignment feature and the constraint can be configured to align the first device and the second device when the alignment feature is inserted into the constraint. The alignment feature and the constraint can be further configured to direct relative movement between the first device and the second device due to relative thermal expansion or contraction between the first device and the second device. The directed relative movement can keep the first device and the second device aligned over a predetermined temperature range.

22 Claims, 27 Drawing Sheets

(56) References Cited

U.S. PATENT DOCUMENTS

| | | |
|---|---|---|
| 7,230,437 B2 | 6/2007 | Eldridge et al. |
| 7,285,968 B2 | 10/2007 | Eldridge et al. |
| 7,404,236 B2 | 7/2008 | Cho et al. |
| 7,419,313 B2 | 9/2008 | Jablonski et al. |
| 7,471,094 B2 | 12/2008 | Hobbs et al. |
| 7,746,089 B2 * | 6/2010 | Hobbs et al. ............. 324/750.25 |
| 7,808,259 B2 * | 10/2010 | Eldridge et al. ......... 324/750.16 |
| 2001/0047762 A1 | 12/2001 | Hayashi |
| 2005/0083499 A1 | 4/2005 | Van De Ven et al. |
| 2005/0205282 A1 | 9/2005 | Toyoda et al. |
| 2006/0290367 A1 * | 12/2006 | Hobbs et al. .................. 324/763 |
| 2008/0231258 A1 | 9/2008 | Hobbs et al. |

OTHER PUBLICATIONS

U.S. Appl. No. 12/327,643, filed Dec. 3, 2008, Breinlinger et al.
International Search Report, PCT application No. PCT/US2009/065425 (Jul. 9, 2010), 5 pages.
Written Opinion of the International Searching Authority, PCT application No. PCT/US2009/065425 (Jul. 9, 2010), 6 pages.

* cited by examiner

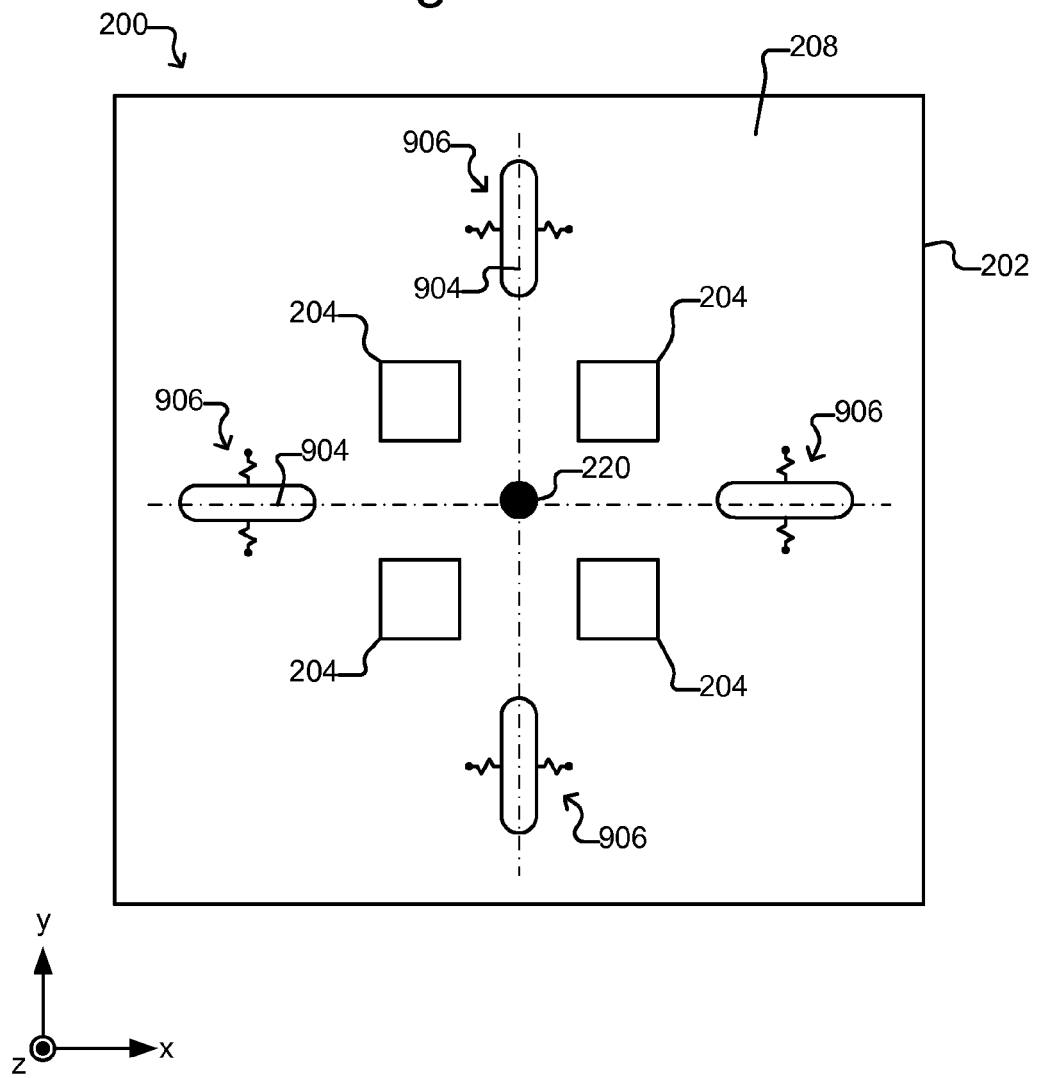

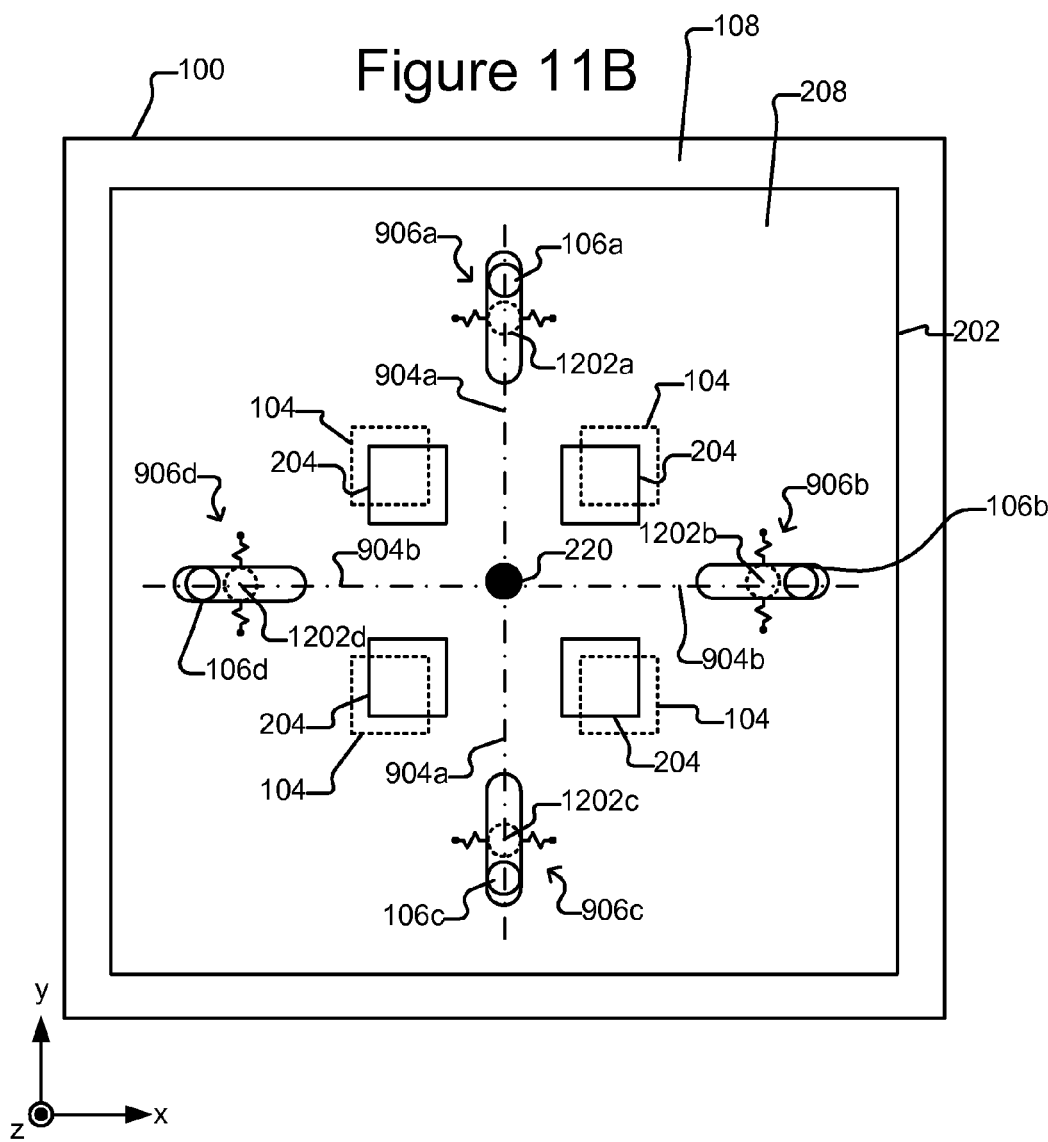

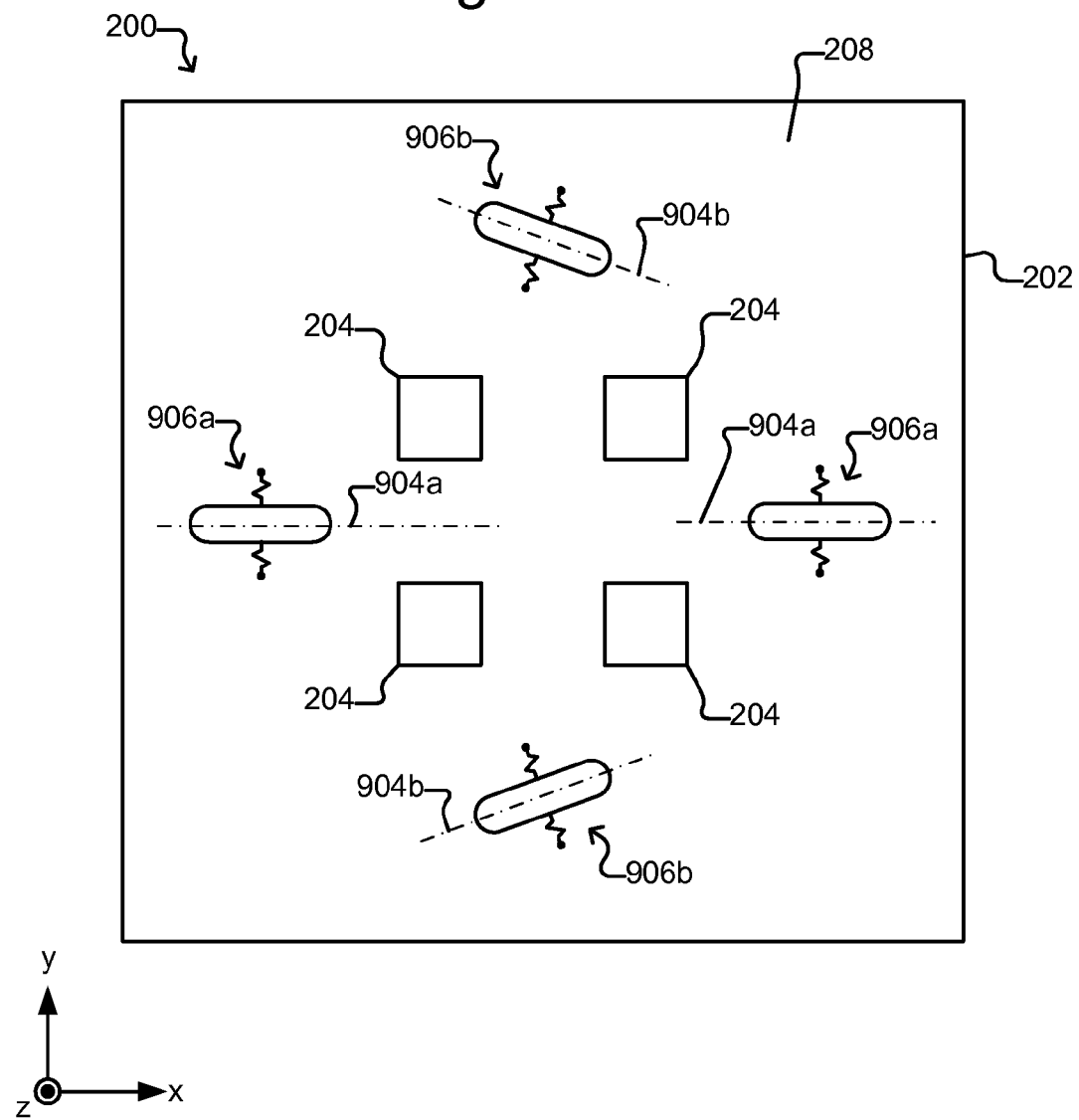

Figure 32
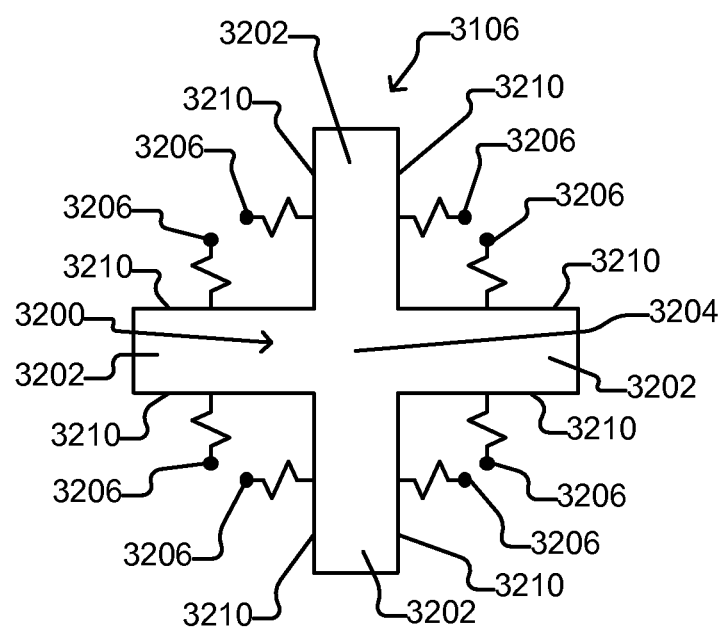
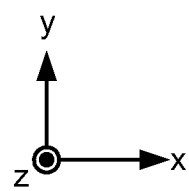

THERMOCENTRIC ALIGNMENT OF ELEMENTS ON PARTS OF AN APPARATUS

BACKGROUND

Some products comprise multiple parts each with a set of elements that must align with corresponding elements on an adjacent part. The parts of such a product must be assembled such that the elements on one of the parts align with the corresponding elements on an adjacent part. If the product is to be operated over a temperature range, it can be useful to couple adjacent parts so that corresponding elements on the adjacent parts of the product remain aligned even as one or both of the adjacent parts undergo thermal expansion or contraction over the temperature range. Some embodiments of the invention can address the foregoing and other problems or issues relating to products with multiple, aligned parts.

SUMMARY

In some embodiments, an apparatus can comprise a first device and a second device. The first device can comprise one or more first elements on a surface of the first device and one or more alignment features extending from the surface of the first device. The second device can comprise one or more second elements disposed in a pattern that corresponds to the one or more first elements, and the second device can further comprise one or more constraints in a surface of the second device disposed in a pattern that corresponds to a pattern of the one or more alignment features. The pattern of the one or more alignment features and the pattern of the one or more constraints can restrict to a predetermined relative motion expansion or contraction of the first device or the second device with respect to the other of the first device or the second device.

In some embodiments, an apparatus can comprise a frame with constraints in the surface of the frame. Each of the constraints can comprise an opening in the surface and a flexures disposed adjacent sidewalls of the opening. The flexures can allow the sidewalls to flex and thereby receive an alignment feature that has a dimension that is larger than the opening. The frame can also include cut outs in the frame, and each cut out can be configured to receive an interposer with spring interconnects in a predetermined orientation with respect to the constraints.

In some embodiments, an apparatus can comprise coupling mechanisms for coupling the apparatus to a mounting surface. The coupling mechanisms can include a first coupling mechanism and a second coupling mechanism disposed on an axis. A first constraint can comprise an opening in the first coupling mechanism, and the opening can be configured to receive a first alignment feature extending from the mounting surface. The first constraint can constrain movement of the device along a first constraint line that is perpendicular to the axis. A second constraint in the second coupling mechanism can be configured to receive a second alignment feature extending from the mounting surface. The second constraint can comprise a first constraining wall oriented to constrain movement of the second alignment feature along a second constraint line disposed at a first acute, non-zero angle with respect to the axis. The second constraint can also comprise a second constraining wall oriented to constrain movement of the second alignment feature along a third constraint line disposed at a acute, non-zero second angle with respect to the axis.

In some embodiments a process of making alignment features on a substrate can comprise depositing material on a surface of the substrate in a pattern that forms elements and alignment marks in predetermined locations with respect to the elements. The process can also include making holes in the surface of the substrate at locations of the alignment marks, and inserting the alignment features into the holes.

BRIEF DESCRIPTION OF THE DRAWINGS

FIG. 11A illustrates an arrangement of the constraints of FIG. 9 on the second device of FIG. 2 in which the constraints are oriented toward a common location according to some embodiments of the invention.

FIG. 11B illustrates movement of the alignment features in the constraints of FIG. 11A according to some embodiments of the invention.

FIG. 12 illustrates an arrangement of the constraints of FIG. 9 on the second device of FIG. 2 in which the constraints are oriented in a particular direction according to some embodiments of the invention

FIG. 32 illustrates an example of the constraint of FIG. 31 according to some embodiments of the invention.

DETAILED DESCRIPTION OF EXEMPLARY EMBODIMENTS

This specification describes exemplary embodiments and applications of the invention. The invention, however, is not limited to these exemplary embodiments and applications or to the manner in which the exemplary embodiments and applications operate or are described herein. Moreover, the Figures may show simplified or partial views, and the dimensions of elements in the Figures may be exaggerated or otherwise not in proportion for clarity. In addition, as the terms "on" and "attached to" are used herein, one object (e.g., a material, a layer, a substrate, etc.) can be "on" or "attached to" another object regardless of whether the one object is directly on or attached to the other object or there are one or more intervening objects between the one object and the other object. Also, directions (e.g., above, below, top, bottom, side, up, down, under, over, upper, lower, horizontal, vertical, "x," "y," "z," etc.), if provided, are relative and provided solely by way of example and for ease of illustration and discussion and not by way of limitation. In addition, where reference is made to a list of elements (e.g., elements a, b, c), such reference is intended to include any one of the listed elements by itself, any combination of less than all of the listed elements, and/or a combination of all of the listed elements.

Figure 1:
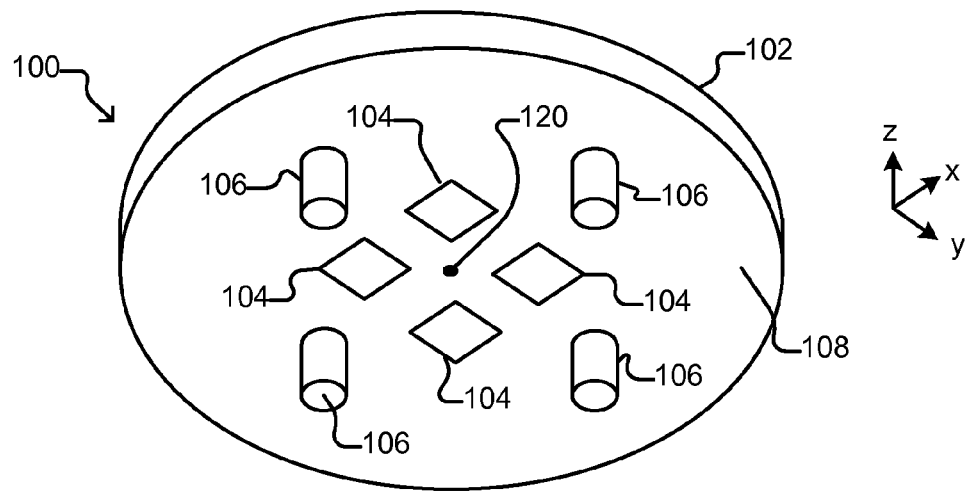
FIG. 1 illustrates a first device with alignment features and first elements according to some embodiments of the invention.
Figure 2:
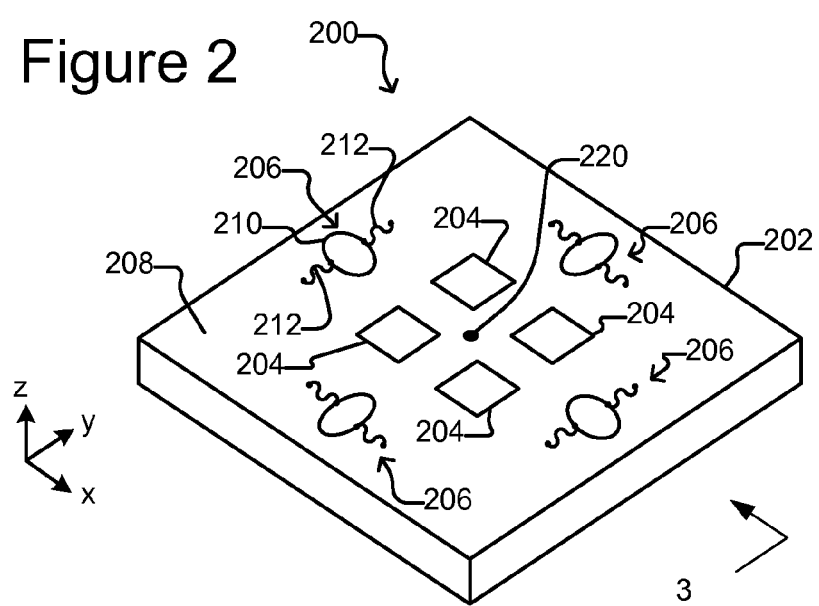
FIG. 2 illustrates a second device with constraints and second elements according to some embodiments of the invention.
Figure 3:
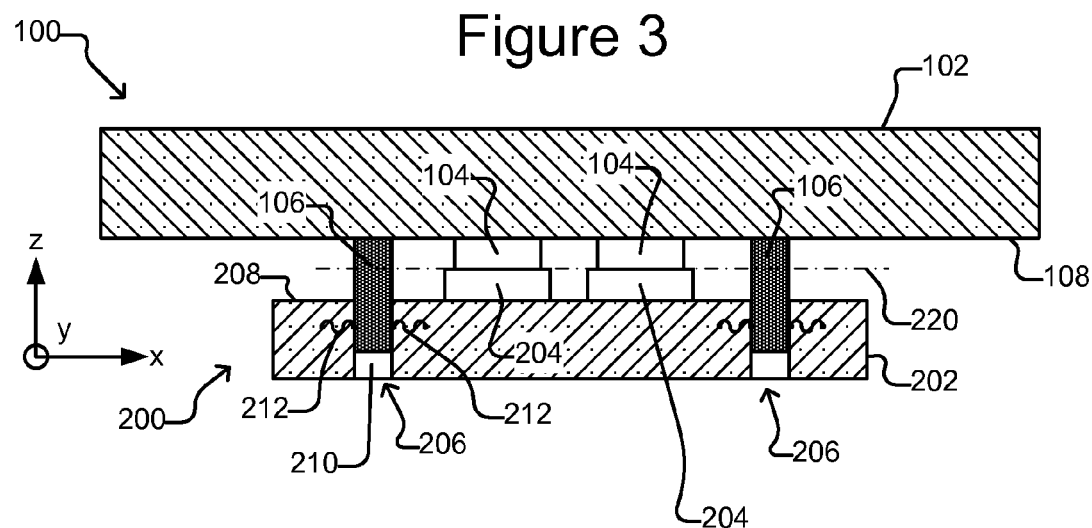
FIG. 3 illustrates the alignment features of the first device inserted into the constraints of the second device, which results in alignment of the first elements with the second elements according to some embodiments of the invention.

FIGS. 1, 2, and 3 illustrate examples of two devices 100 and 200 with alignment features 106 and constraints 206, respectively, that align the first device 100 with respect to the second device 200 according to some embodiments of the invention. For example, the alignment features 106 and constraints 206 can align the first device 100 with respect to the second device 200 such that first elements 104 on the first device 100 align with second elements 204 on the second device 204. The alignment features 106 can be relatively non-compliant (that is, stiff), and the constraints 206 can be relatively compliant (that is, flexible). Alternatively, the alignment features 106 can be compliant, and the constraints 206 can be non-compliant. Compliant means flexible, and non-compliant means stiff.

As shown, the first device 100 can comprise a structure 102 with the first elements 104 on the structure 102, and the second device 200 can comprise a structure 202 with the second elements 204 on the structure 202. For example, the first elements 104 can be on a surface 108 of the first structure 102, and the second elements can be on a surface 208 of the second structure 202. The structure 102 can be any structure that can support the alignment features 106, and the structure 202 can be any structure that can support the constraints 206. For example, the first structure 102 and/or the second structure 202 can comprise one or more substrates (e.g., a rigid ceramic wiring substrate, a semi-rigid printed circuit board, a metal frame, an interposer, or a combination of the foregoing). The first device 100 can include alignment features 106 that extend from the surface 108 of the first device 100, and the second device 200 can include corresponding constraints 206 for receiving the alignment features 106. The alignment features 106 can be positioned in predetermined locations with respect to the first elements 104 on the surface 108 of the first device 100, and the constraints 206 can be positioned in predetermined locations with respect to the second elements 204 on the surface 204 such that when the alignment features 106 are inserted into the constraints 206, the first elements 104 align with the second elements 204 in a plane 220 that is generally parallel with the surfaces 108 and 208 (e.g., the "x,y" plane in FIG. 3). It is noted that, although four first elements 104 and four second elements 204 are shown, fewer or more first elements 104 and second elements 204 can be used. For example, there can be one or more of the first elements 104 and one or more of the second elements 204. It is also noted that, although the first elements 106 and the second elements 206 are shown in physical contact in FIG. 3, the first elements 106 and the second elements 206 need not be in physical contact. For example, the first elements 106 can be aligned with the second elements 206 but there can be a gap between the first elements 106 and the second elements 206. The shapes of the first device 100 and the second device 200 shown in FIGS. 1 and 2 are examples only. The first device 100 can have any shape, and the second device 200 can have any shape.

The alignment features 106 can be structures that extend from the surface 108 of the first device 100 on which the first elements 104 are disposed. In some embodiments, the alignment features 106 can be cylindrical pin structures. In other embodiments, the alignment features 106 can be other shapes (e.g., cubic, having a rectangular cross section, etc.). Each constraint 206 can comprise an opening 210 in the surface 208 of the second device 200 for receiving one of the alignment features 106, and each constraint 206 can further comprise one or more flexures 212 that allow sidewalls of the opening to flex. As mentioned, the alignment features 106 can be non-compliant.

The flexures 212 can serve any of a number of possible purposes. For example, the flexures 212 can flex to allow an opening 210 to receive an alignment feature 106 that is larger than the opening 210. An alignment feature 106 can be larger than an opening 210 for any number of reasons. For example, in some embodiments, the alignment features 106 can intentionally be made larger than the openings 210. As another example, even if the alignment features 106 are not intentionally made larger than the openings 210, due to manufacturing variations, some of the alignment features 106 may nevertheless be larger than some of the openings 210. The flexures 212 of a constraint 206 can thus accommodate size errors in one or more alignment features 106 and/or one or more openings 210 of the constraints 206.

The flexures 212 can also accommodate errors in the position of one or more of the alignment features 106 and/or the constraints 206. That is, the flexures 212 of each constraint 206 can allow the openings 210 to move at least a small amount to receive alignment features 106 some of which may not be perfectly aligned with an opening 210. Thus, because of the flexures 212, the openings 210 can accommodate at least small errors in the actual positions of one or more of the alignment features 106 and/or one or more of the constraints 206 from the intended positions. Thus, even if one or more of the alignment features 106 does not align exactly with a corresponding constraint 206, the flexures 212 can allow the opening 210 of a constraint to flex and thus receive a misaligned alignment feature 106. Such positional errors that result in one or more alignment features 106 being misaligned with a corresponding constraint 206 can be an inherent part of most manufacturing processes.

Moreover, if the number of alignment features 106 and corresponding constraints 206 over constrain the first device 100 with respect to the second device 200, the flexures 212 of the 206 constraints can elastically average the errors in the positions of the alignment features 106 and/or constraints 206. This is because the positional error of at least one alignment feature 106 or constraint 206 is likely to offset at least partially the positional error of at least one other alignment feature 106 or constraint 206. As discussed, the flexures 212 allow an opening to flex to accommodate a misaligned alignment feature 106, which means that all of the constraints 206 together can allow sufficient stretching or movement such that the offsetting positional errors cancel in whole or in part. The flexures 212 can thus average—as opposed to summing—the positional errors of each individual alignment feature 106 and constraint 206, which typically results in a smaller total positional error between the first device 100 and the second device 200 than summing the individual error. This elastic averaging can occur, as mentioned above, if the number of alignment features 106 and corresponding constraints 206 over constrains the first device 100 with respect to the second device 200. As is known, a device is over constrained if the device's movement is constrained in more than the degrees of freedom of movement of the device. For example, a device can typically move in three degrees of freedom in a plane or six degrees of freedom in three-dimensional space. Unconstrained, the first device 100 can thus move in three degrees of freedom in the "x,y" plane: (1) translation along the "x" axis, (2) translation along the "y" axis, and (3) rotation around the "z" axis. Thus, the first device 100 is typically over constrained in the "x,y" plane if constrained by more than three constraints. The first device 100 is thus typically over constrained in the "x,y" plane if the first device 100 includes four or more alignment features 106, and the second device 200 includes four or more corresponding constraints 206. In some embodiments, however, the first device 100 can have less than four alignment features 106 (e.g., three alignment features 106) or more than four alignment features 106, and the second device 200 can likewise have less than four constraints 206 (e.g., three constraints 206) or more than four constraints 206. In some embodiments, the first device 100 can have one or more alignment features 106, and the second device can have one or more corresponding constraints 206. For example, one constraint 206 can be configured to constrain a corresponding pin along two constraint lines. The constraint 2012 of FIG. 20 (including any of constraints 2212 and 2512 in FIGS. 22-26) can replace one or more of the constraints 206 on the second device 200 in FIGS. 2 and 3, and two constraints 206 can kinematically constrain the first device 100 with respect to the second device 100.

The alignment features 106 and constraints 206 can be made to hold the first device 100 and the second device 200 in alignment even if other elements give rise to forces that tend to push the first device 100 and the second device 200 out of alignment. For example, the alignment features 106 can be made to form a friction fit with the constraints 206. For example, the alignment features 106 can be oversized with respect to the constraints 206 and thereby form a friction fit.

Although the alignment features 106 are described above as non-compliant and the constraints 206 are described as compliant, in some embodiments, the alignment features 106 can also be compliant. For example, the alignment features 106 can be flexible in at least the "x,y" plane in FIG. 1. Such alignment features 106 can alternatively or also be compressible. The alignment features 106 can be made compliant in any suitable manner. For example, the alignment features 106 can be sufficiently elongate in the "z" direction in FIG. 1 to be complaint in the "x,y" plane. As another example, each of the alignment features 106 can be thinner in the middle than at the ends. For example, each of the alignment features 106 can comprise ends that are generally cylindrical with a middle portion connecting the ends that is a thin blade structure. As yet another example, the alignment features 106 can be made of a flexible and/or a compressible material. If the alignment features 106 are flexible, regardless of how the alignment features are made flexible, the constraints 206 can be compliant as described above, or the constraints 206 can be non-compliant. For example, the constraints 206 can lack the flexures 212.

Figure 4:
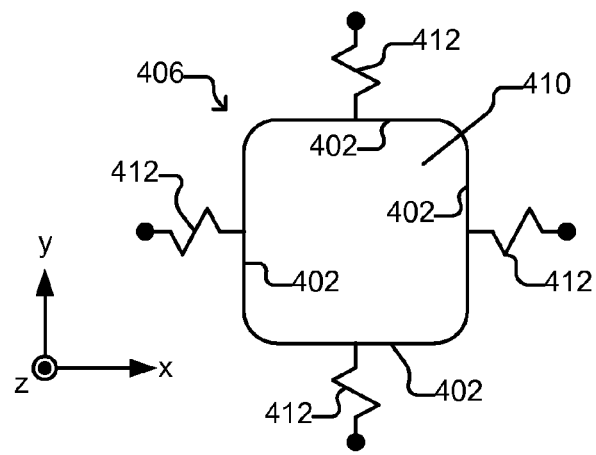
FIG. 4 illustrates an example of the constraints of the second device of FIG. 2 according to some embodiments of the invention.
Figure 5:
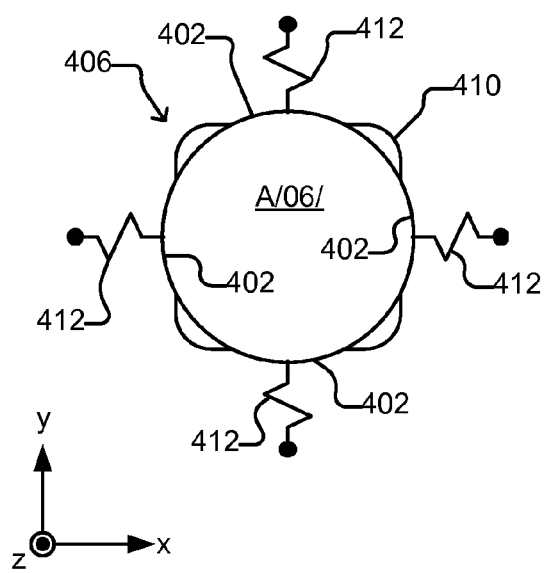
FIG. 5 shows an opening of the constraint of FIG. 4 flexing to receive an oversized alignment feature according to some embodiments of the invention.
Figure 6:
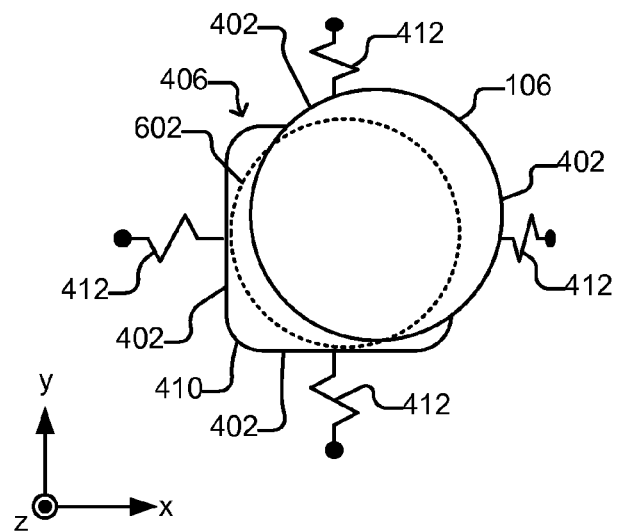
FIG. 6 shows the opening of the constraint of FIG. 4 flexing to receive an alignment feature misaligned with the constraint according to some embodiments of the invention.

Nevertheless, the constraints 206 with flexures 212 can be implemented in many different ways. FIGS. 4, 5, 6, 7, 8, 9, 10, 13, and 14 illustrate non-limiting examples of constraints 206. FIG. 4 illustrates a constraint 406 that can be an example of an implementation of the constraints 206 in FIGS. 2 and 3. As shown, the constraint 406 can include an opening 410, which can be an opening in the surface 208 of the second device 200 of FIGS. 2 and 3. The opening 410 can be sized and/or shaped to receive one of the alignment features 106 of the first device 106 of FIGS. 1 and 3. As shown in FIG. 4, each of the side walls 402 of the opening 410 can include one or more flexures 412. Each flexure 412 can allow its associated side wall 402 to flex. As shown in FIG. 5, each side wall 402 can flex to receive, for example, an oversized alignment feature 106 as generally discussed above. As shown in FIG. 6, one or more of the side walls 402 can flex to accommodate an alignment feature 106 that is misaligned with the opening 410. In such a case, as discussed above, there may be a positional error in the placement of the alignment feature 106 on the surface 108 of the first device 100 (see FIG. 1) and/or the opening 410 on the surface 208 of the second device 200 (see FIG. 2). In FIG. 6, the dashed outline 602 shows the correct position of the alignment feature 106 with respect to the opening 410. Although the opening 402 is shown in FIG. 4 as generally square, the opening 402 can have other shapes.

Figure 7:
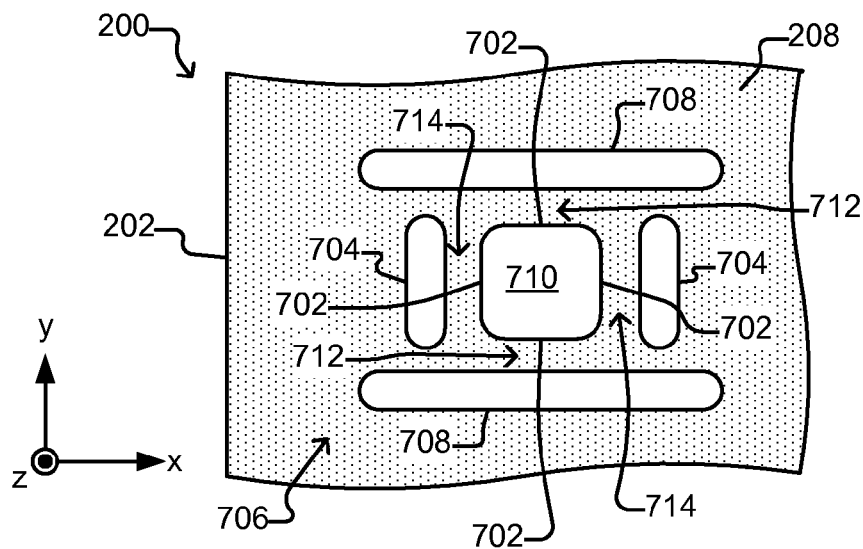
FIG. 7 shows an example of the constraint of FIG. 4 according to some embodiments of the invention.

FIG. 7 illustrates a constraint 706 formed in the surface 208 of the second device 200 that is an example of an implementation of the constraint 406 of FIG. 4 according to some embodiments of the invention. FIG. 7 shows a top view of part of the surface 208 of the second device 200. As shown, the constraint 706 can include a center opening 710 in the surface 208 and a plurality of side slots 704 and 708 disposed adjacent the center opening 710. The side slots 704 and 708 can comprise additional openings in the surface 208 of the second device 200. The openings that comprise the side slots 704 and 708 can extend partially into or entirely through the second device 200.

Figure 8:
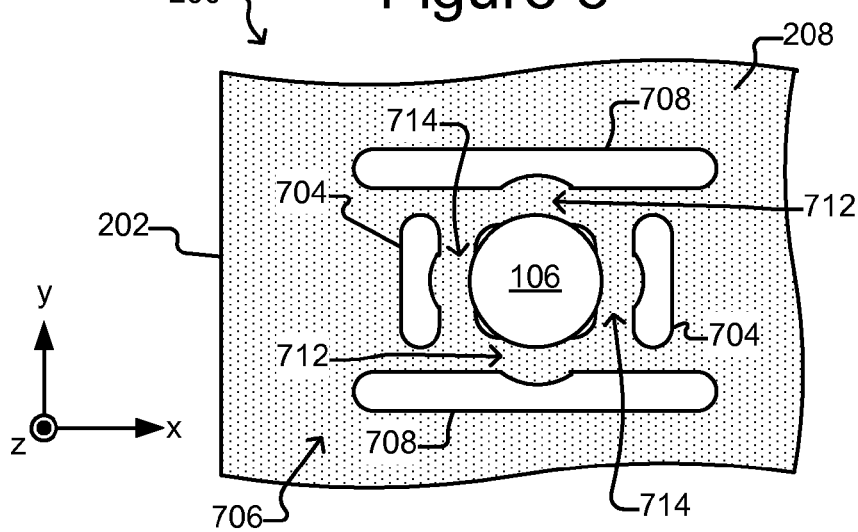
FIG. 8 shows flexures of the constraint of FIG. 7 flexing to review an oversized alignment feature according to some embodiments of the invention.

As shown, each of the side slots 704 and 708 can be disposed adjacent one of the side walls 702 of the center opening 710 and can run at least the length of the side wall 702. Each of flexures 712 and 714 (e.g., comparable to flexures 412 in FIG. 4) can comprise a portion of the surface 208 of the second device 202 between one of the side walls 702 and one of the side slots 704 and 708. The thickness of a flexure 712 or 714 (i.e., the width of the portion of the surface 208 between a side wall 702 and one of the side slots 704 or 708) can be selected to provide a desired level of flexibility to the flexure 712 or 714. For example, the thickness of a flexure 712 or 714 can be selected such that the flexures 712 and 714 readily flex to receive an alignment feature 106 that is larger than the center opening 710 as shown in FIG. 8. It is noted that the side slots 704 and 708 can allow the flexures 712 and 714 to flex or move even if the side slots 704 and 708 do not extend entirely through the second device 200.

Figure 9:
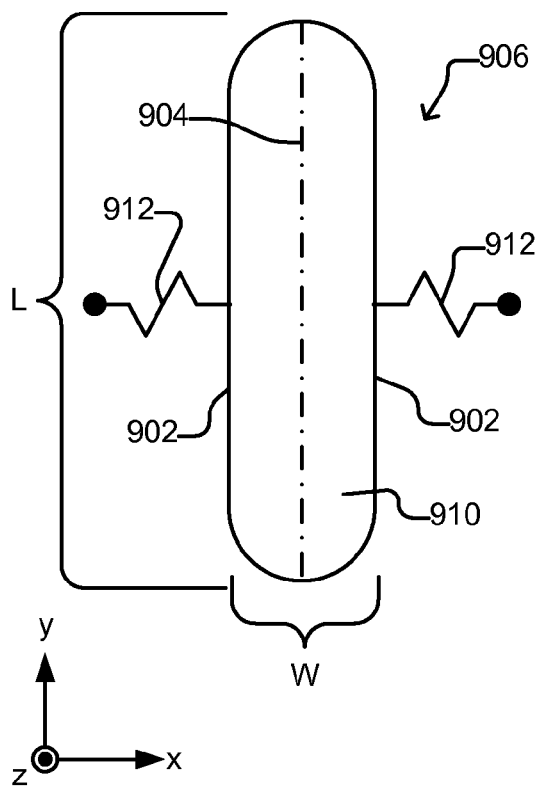
FIG. 9 illustrates another example of the constraints of the second device of FIG. 2 according to some embodiments of the invention.
Figure 10:
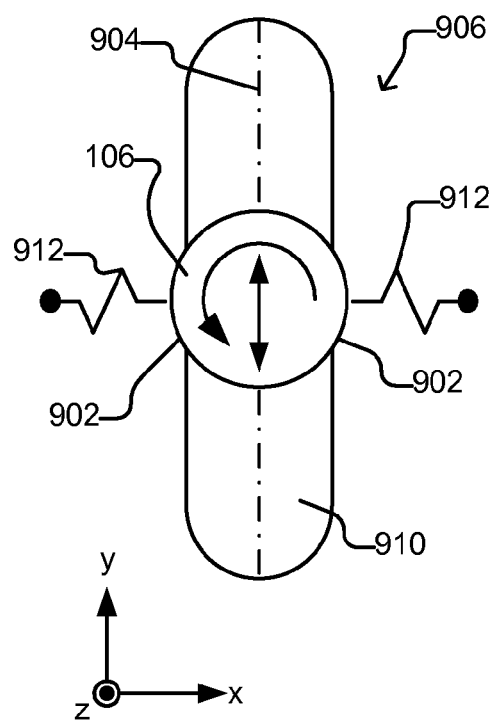
FIG. 10 shows degrees of freedom of the alignment feature in the constraint of FIG. 9 according to some embodiments of the invention.

FIG. 9 illustrates a constraint 906 that can be another example of an implementation of the constraints 206 in FIGS. 2 and 3. As shown, the constraint 906 can include an elongate opening 910, which can be an opening in the surface 208 of the second device 200 of FIGS. 2 and 3. The opening 910 can be elongate (e.g., the length L of the opening 910 can be greater than the width W as shown in FIG. 910). (A center axis 904 oriented along the length L of the elongate opening 910 is shown in FIG. 9.) As shown in FIG. 9, elongate side walls 902 of the opening 910 can each include flexures 912. Each flexure 912 can allow its associated elongate sidewall 902 to flex. As shown in FIG. 10, each elongate side wall 402 can flex to receive, for example, an alignment feature 106 that has a dimension (e.g., a diameter or width) that is greater than the width W of the elongate opening 910. Although not shown, one or both of the elongate side walls 902 can flex to accommodate an alignment feature 106 that is misaligned with the elongate opening 910 (e.g., a center of the alignment feature 106 is not aligned with the center axis 904 of the elongate opening 910). Generally as discussed above with respect to FIG. 6, in such a case, there may be a positional error in the placement of the alignment feature 106 on the surface 108 of the first device 100 (see FIG. 1) and/or the elongate opening 910 on the surface 208 of the second device 200 (see FIG. 2).

As also illustrated in FIG. 10, the elongate opening 910 can be shaped both (1) to receive one of the alignment features 106 of the first device 100 of FIG. 1 as discussed above, and (2) to restrict movement of the alignment feature 106 in one or more degrees of freedom while allowing movement of the alignment feature 106 in one or more other degrees of freedom. As shown in FIG. 10, the elongate opening 910 in the example illustrated can allow the alignment feature 106 inserted into the elongate opening 910 to translate along the center axis 904 (the "y" axis in FIGS. 9 and 10) and further allow the alignment feature 106 to rotate about two axes (the "z" axis and the "x" axis in FIGS. 9 and 10). Although elongate side walls 902 of elongate opening 910 can flex to accommodate an oversized alignment feature 106 or a misaligned alignment feature 106 as discussed above and thus allow limited translational movement perpendicular (the direction of the "x" axis in FIG. 10) to the center axis 904, the elongate slot 910 otherwise impedes relative translational movement of the alignment feature 106 along the "x" axis. The elongate opening 910 thus substantially constrains translational movement of the alignment feature 106 in the "x" direction.

As illustrated in FIGS. 11A and 11B and discussed below, a plurality of the constraints 906 can be oriented on the second device 200 so that the constraints 906, as a group, allow relative expansion or contraction of the first device 100 and the second device 200 radially from a location 220 in a plane (the "x,y" plane in FIGS. 11A and 11B) that is generally parallel to the surfaces 108 and 208 of the first device 100 and the second device 200, respectively, while otherwise constraining relative movement of the first device 100 and the second device 200 in the plane. In some embodiments, the location 120 can be a centroid of the first elements 104 on the first device 100, and the location 220 can be a centroid of the second elements 204 on the second device 200. In other embodiments, the location 120 can be other than a centroid of the first elements 104 on the first device 100, and the location 220 can be other than a centroid of the second elements 204 on the second device 200. Although the foregoing is in a plane, the principles can be extended to three-dimensional space.

Generally in accordance with the discussion of FIGS. 1, 2, and 4 above, the alignment features 106 can be oriented on the surface 108 of the first device 100 with respect to the first elements 104, and the constraints 906 can be oriented on the surface 208 of the second device 200 with respect to the second elements 204 such that the first elements 104 align with the second elements 204 as generally shown in FIG. 3. The location 120 on the first device 100 and the location 220 on the second device 200 (see FIGS. 1 and 2) can be selected to align one with another when the alignment features 108 are inserted into the constraints 906.

In addition, as shown in FIG. 11A, the center axis 904 of each constraint 906 can be oriented on the surface 208 of the second device 200 such that the center axis 904 intersects the location 220 on the second device 200. As generally discussed above, the constraints 906, as a group, can allow each alignment feature 106 to translate along the center axis 904 of the elongate opening 910 into which the alignment feature 106 is inserted but can otherwise generally restrict movement of the alignment feature 106 in the "x,y" plane. The result can be that the first device 100 and the second device 200 can expand or contact radially in the "x,y" plane from the location 120 or 220 but otherwise cannot move in the "x,y" plane.

Moreover, as illustrated in FIG. 11B, as the first device 100 and the second device 200 expand or contract relative to each other, the constraints 906 tend to keep the locations 120 and 220 aligned and impede rotation of the first device 100 and the second device 200 about the locations 120 and 220. For example, FIG. 11B illustrates an example in which alignment features 106a, 106b, 106c, and 106d have moved from initial positions 1202a, 1202b, 1202c, and 1202d due to expansion of the first device 100 with respect to the second device 200 and/or due to contraction of the second device 200 with respect to the first device 100. It is noted that the first elements 104 are shown in dashed lines in FIG. 11B because the first elements are not visible in the view of FIG. 11B. Because the constraints 906a and 906c constrain (i.e., impede) movement of the alignment features 106a and 106c in the "x" direction in FIG. 11B (as discussed above), the constraints 906a and 906c will tend to keep the alignment features 106b and 106d centered about the location 220 even as the alignment features 106b and 106d move in the "x" direction within the constraints 906b and 906d. Likewise, because the constraints 906b and 906d constrain (i.e., impede) movement of the alignment features 106b and 106d in the "y" direction in FIG. 11B (as discussed above), the constraints 906b and 906d will tend to keep the alignment features 106a and 106c centered about the location 220 even as the alignment features 106a and 106c move in the "y" direction within the constraints 906a and 906c. Thus, as the first device 100 expands and contracts with respect to the second device 200, the constraints 906a, 906b, 906c, and 906d keep the alignment features 106a, 106b, 106c, and 106d centered about the location 220 and thus keep the locations 120 and 220 on the first device 100 and the second device 200 aligned during such expansion or contraction. Keeping the locations 120 and 220 aligned also keeps the first elements 104 and the 204 structures aligned at least over a particular temperature range.

As shown in FIG. 11B, the pattern of the constraints 906 can be such that the length of at least one of the constraints (e.g., 906a) is disposed along an axis (e.g., 904a) that is approximately perpendicular to an axis (e.g., 904b) along which the length of at least one other of the constraints (e.g., 906b) is disposed. As also shown in FIG. 11B, the pattern of the constraints 906 can be such that the lengths of pairs (e.g., 906a and 906c) of the constraints 906 are disposed along a common axis (e.g., axis 904a), and for each pair (e.g., 906a and 906c) disposed along an axis (e.g., 904a), there is another pair (e.g., 906b and 906d) disposed along a perpendicular axis (e.g., 904b). Nevertheless, as noted above, there can be fewer or more than four alignment features 106 on the first device 100 and fewer or more than four constraints 906 on the second device 200. Moreover, the constraints 906 need not be oriented such that any of the axes 904 are perpendicular or collinear. Indeed, the pattern or layout of the alignment features 906 in FIGS. 11A and 11B is an example only, and the alignment features 906 (and the corresponding alignment features 106) can be laid out in other patterns.

Although the axes 904 of each of the constraints 906 in the example shown in FIGS. 11A and 11B are oriented toward the location 220, the axes 904 of the constraints 906 can be oriented in other ways. For example, the axes 904 can be oriented to cause relative movement due to thermal expansion or contraction between the first device 100 and the second device 200 to be in a particular direction. FIG. 12 illustrates an example in which the axes 904a of some of the constraints 906a (two in FIG. 12 but more or fewer in other configurations) are oriented parallel to a particular direction (the "x" axis in FIG. 12), and the axes 904b of some of the constraints 906b (two in FIG. 12 but more or fewer in other configurations) are angled with respect to that particular direction. In such a case, relative movement due to thermal expansion or contraction between the first device 100 and the second device 200 will be in the particular direction (e.g., along the "x" axis in the example of FIG. 12). For example, relative expansion of the second device 200 in the example of FIG. 12 will result in the second device moving to the left in FIG. 12 along the "x" axis. Relative contraction of the second device 200 with respect to the first device 100 will result in the second device moving to the right along the "x" axis. Motion can thus be created between the first device 100 and the second device 200 that is a function of the temperature of the first device 100 and the second device 200.

Figure 13:
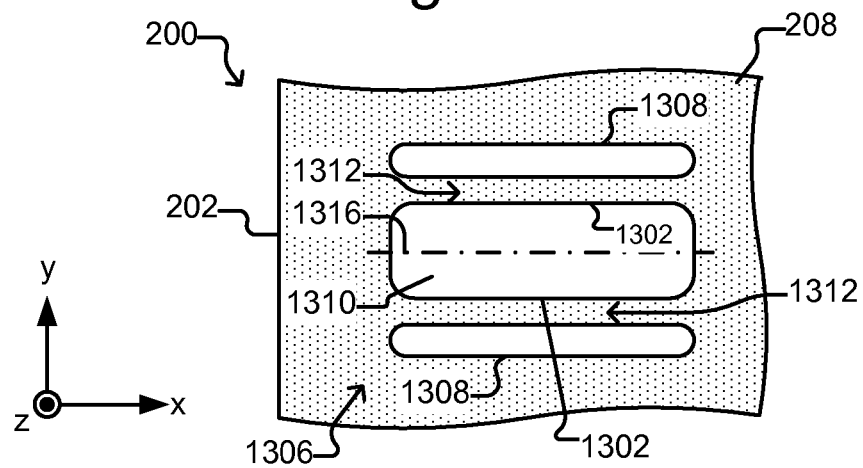
FIG. 13 shows an example of the constraint of FIG. 9 according to some embodiments of the invention.

FIG. 13 illustrates a constraint 1306 formed in the surface 208 of the second device 200 that is an example of an implementation of the constraint 906 of FIG. 9 according to some embodiments of the invention. FIG. 13 shows a top view of part of the surface 208 of the second device 200. As shown, the constraint 1306 can include a center slot 1310 in the surface 208 and a plurality of side slots 1308 disposed adjacent the center slot 1310. The side slots 1308 can comprise additional openings in the surface 208 of the second device 200. The openings that comprise the center opening 1310 and/or the side slots 1308 can partially extend into or entirely through the second device 200.

Figure 14:
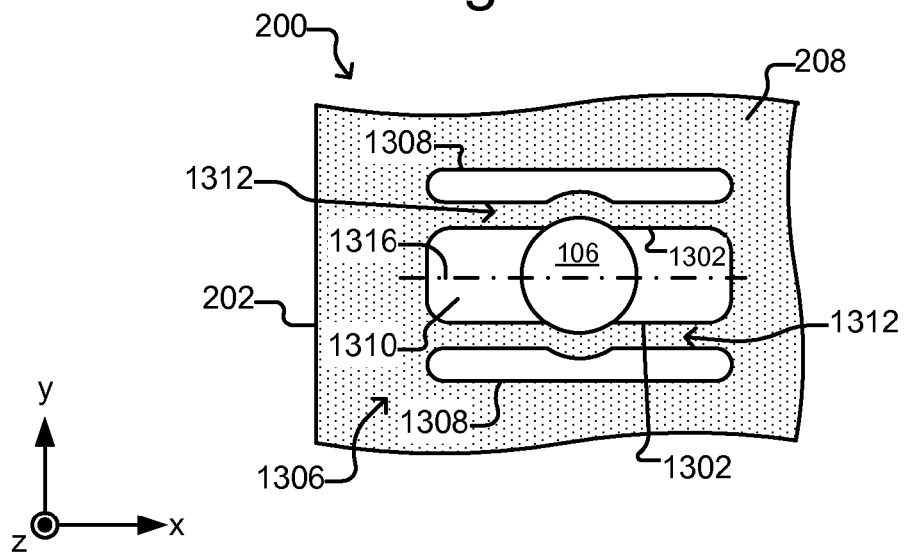
FIG. 14 shows flexures of the constraint of FIG. 13 flexing to review an oversized alignment feature according to some embodiments of the invention.

As shown, each of the side slots 1308 can be disposed adjacent one of the sidewalls 1302 of the center slot 1310 and can run at least the length of the sidewall 1302. Each of flexures 1312 (examples of the flexures 912 in FIG. 9) can comprise a portion of the surface 208 of the second device 202 between one of the side walls 1302 and one of the side slots 1308. The thickness of a flexure 1312 (i.e., the width of the portion of the surface 208 between a side wall 1302 and one of the side slots 1308) can be selected to provide a desired level of flexibility to the flexure 1312. For example, the thickness of a flexure 1312 can be selected such that the flexures 1312 readily flex to receive an alignment feature 106 that is larger than the center slot 1310 as shown in FIG. 14. It is noted that the side slots 1308 can allow the flexures 1312 to flex or move even if the side slots 1308 do not extend entirely through the second device 200.

The devices 100 and 200 are examples only, and variations are possible. For example, structure 102 and/or structure 202 can be replaced with a multi-structure assembly. Thus, for example, the structure 202 can comprise two or more substrates that are assembled or otherwise coupled to each other, and the constraints 206 can be on the surface of one of the substrates while the second elements 204 are on the surface of another of the substrates.

There are many possible applications of the alignment features 106 and constraints 206 discussed above. For example, the first device 100 of FIG. 1 and the second device 200 of FIG. 2 can be part of a mechanical apparatus, an optoelectronic apparatus, a microelectronic mechanical system (MEMS) apparatus, a chemical analysis apparatus, a medical product, a test apparatus, or motor. Indeed, the first device 100 and the second device can be part of any apparatus in which the two devices must be aligned.

Figure 15:
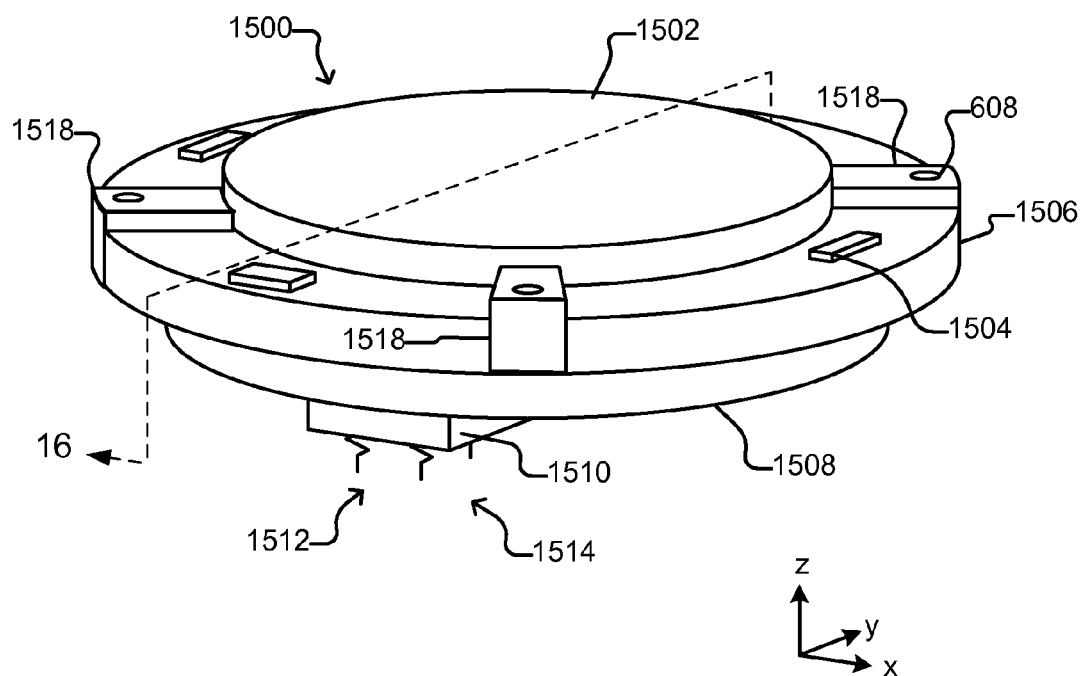
FIG. 15 illustrates an exemplary probe card assembly according to some embodiments of the invention.
Figure 16:
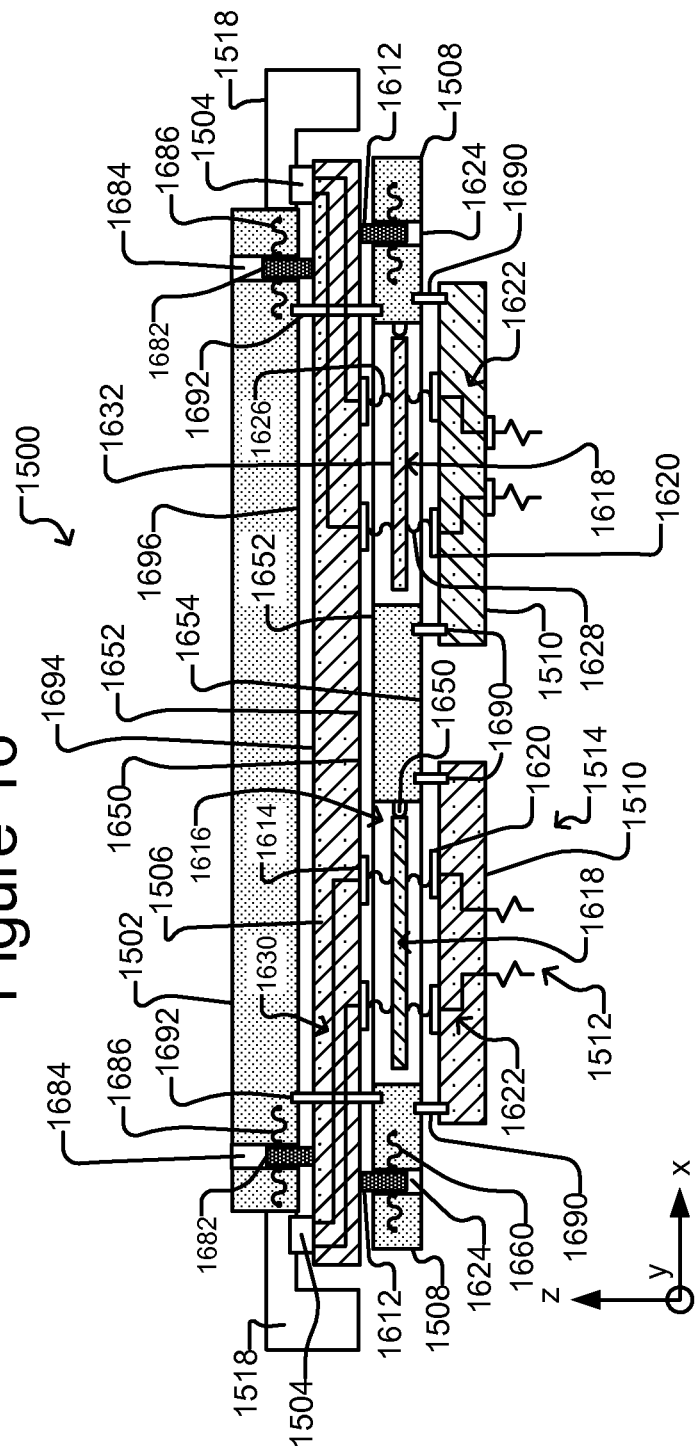
FIG. 16 illustrates a cross-sectional side view of the probe card assembly of FIG. 15 according to some embodiments of the invention.

FIGS. 15 and 16 illustrate another application of the alignment features 106 and constraints 206 discussed above. Those figures illustrate an example of a probe card assembly 1500 (which can be an example of an apparatus) that can utilize alignment features and constraints like those described above to align parts of the probe card assembly 1500. As will be discussed, the probe card assembly 1500 can be used in a test system to test electronic devices (e.g., semiconductor dies). When alignment features 1612 that extend from a surface 1650 of a wiring substrate 1506 of the probe card assembly 1500 are inserted into constraints 1624 in a surface 1652 of a frame 1508, electrical connections (e.g., 1626) disposed in cut outs 1616 in the frame 1508 align with the terminals 1614 on the wiring substrate 1506. Interposers 1618 can be examples of such electrical connectors. For ease of illustrate and discussion, FIG. 16 is illustrated and discussed below with interposers 1618 as examples of such electrical connections, but the electrical connections in the cut outs 1616 of the frame 1508 need not be in the form of an interposer 1618. As shown in FIG. 16, when the alignment features 1612 of the wiring substrate 1506 are inserted into the constraints 1624 of the frame 1508, spring interconnects 1626 of the interposers 1618 in the cut outs 1616 in the frame 1508 align with the terminals 1614 on the surface 1650 of the wiring substrate 1506. The wiring substrate 1506 can thus be an example of the first device 100 of FIGS. 1 and 3, and the terminals 1614 on the wiring substrate 1506 can be an example of the first elements 104. Likewise, the frame 1508 and the interposers 1618 positioned in the cut outs 1616 in the frame 1508 can be an example of the second device 200 of FIGS. 2 and 3, and the spring interconnects 1626 of the interposers 1618 can be an example of the second elements 204.

With reference to FIGS. 15 and 16, the probe card assembly 1500 will now be described. As shown, the probe card assembly 1500 can include a stiffener 1502, a wiring substrate 1506, a frame 1508, and one or more probe assemblies 1514 each of which can comprise a probe substrate 1510 and probes 1512. FIG. 16 shows a simplified cross-sectional side view of the probe card assembly 1500. As shown, coupling mechanisms 1692 can couple the stiffener 1502 to the frame 1508, and coupling mechanisms 1690 can couple the probe substrates 1510 to the frame 1508. The coupling mechanisms 1692 can be any mechanism suitable for coupling the stiffener 1502 and the frame 1508. For example, the coupling mechanisms 1692 can comprise bolts, screws, clamps, pins, adhesives, brackets, joints, or any other such coupling mechanisms or any combination of the foregoing. The coupling mechanisms 1690 can be any mechanism suitable for coupling a probe substrate 1510 to the frame 1508. For example, the coupling mechanisms 1690 can comprise bolts, screws, clamps, pins, adhesives, brackets, joints, or any other such coupling mechanisms or any combination of the foregoing.

As also shown in FIG. 16, the probe card assembly 1500 can include a second set of alignment features 1682 and constraints 1684, which can include flexures 1692. The second alignment features 1682 can extend from a surface 1694 of the wiring substrate 1506 that faces the stiffener 1502, and the second alignment features 1682 can mate with the second constraints 1684 in a surface 1696 of the stiffener 1502 that faces the wiring substrate 1506. The second alignment features 1682 can otherwise be like the alignment features 1612, and the second constraints 1684 can be like the alignment features 1624. The second alignment features 1682 and the second constraints 1684 can be disposed on the wiring substrate 1506 and the stiffener 1502, respectively, to further align the electrical connections (e.g., 1626) disposed in the cut outs 1616 in the frame 1508 with the terminals 1614 on the wiring substrate 1506. As mentioned above, interposers 1618 can be examples of such electrical connectors.

With reference to FIG. 16, electrical connections within the probe card assembly 1500 will now be discussed. As shown, electrical connectors 1504 (e.g., zero-insertion-force electrical connectors, pogo alignment feature pads, etc.) can be disposed on the wiring substrate 1506, which can be a semi-rigid substrate such as a printed circuit board. As will be seen, the electrical connectors 1504 can be connected to a test controller (not shown in FIGS. 15 and 16) that controls testing of the electronic devices (not shown). Electrical connectors 1504 in FIG. 16 can thus be an electrical interface to a test controller.

Multiple individual electrical paths can be provided between the connectors 1504 and the probes 1512. For example, electrical connections 1630 (e.g., electrically conductive traces and/or vias) through the wiring substrate 1506 can connect the connectors 1504 with terminals 1614 on the wiring substrate 1506 as shown in FIG. 16. Electrical connections can be provided between the terminals 1614 on the wiring substrate 1506 and terminals 1620 on the probe substrates 1510. Interposers 1618 are non-limiting examples of such electrical connections. As shown, interposers 1618 can electrically connect the terminals 1614 on the wiring substrate 1506 with terminals 1620 on one or more of the probe assemblies 1514. In some embodiments, each interposer 1618 can include electrically conductive spring interconnects 1626 and 1628 that extend from opposite sides of an interposer body 1624 (e.g., a rigid or semi-rigid substrate such as a printed circuit board, a semiconductor substrate, a ceramic substrate, etc.). Individual spring interconnects 1626 extending from one side of the interposer body 1624 can be electrically connected through the interposer body 1624 to individual spring interconnects 1628 on the opposite side of the interposer body 1624. As shown in FIG. 16, the interposers 1618 can be disposed in cut outs 1616 in the frame 1508. Each probe assembly 1514 can include a probe substrate 1510 (e.g., a rigid or semi-rigid substrate such as a printed circuit board, a semiconductor substrate, a ceramic substrate, etc.) and electrically conductive probes 1512 for contacting the electronic devices to be tested. Each probe substrate 1510 can provide a space transformation from one side to the other such that the probes 1512 on one side are spaced at a closer pitch than the terminals 1620 on the other side. The terminals 1620 on the probe substrate 1510 can be electrically connected to the probes 1512 by electrical connections 1622 (e.g., traces and/or vias on and/or in the probe substrate 1510).

As shown, the wiring substrate 1506 can be disposed between the stiffener 1502 and the frame 1508. The stiffener 1502 can comprise a mechanically stiff structure that can stiffen the probe card assembly 1500 in the "z" direction. In some embodiments, the stiffener 1502 can comprise metal such as stainless steel or aluminum. The stiffener 1502 can be in the form of a plate structure, which can be a solid, layered, or a honey-combed structure. The stiffener 1502 can provide at least one or more of the following: be sufficiently stiff to minimize deformation of the probe card assembly 1500 due to probe loads applied to or generated within the probe card assembly 1500; minimize deformation of the wiring substrate 1506 to the connection loads (e.g., interposer 1618 loads); be sufficiently stiff to allow bending of the frame 1508 relative to the stiffener 1502; be a structural connector; provide mechanical coupling to a test system (e.g., the housing 1920 of FIG. 19); be thermally conductive to minimize warping due to thermal gradients; and/or provide alignment between the probe card assembly 1500 and a test system (e.g., the test system 1900 of FIG. 19). The stiffener 1502 can include coupling arms 1518, which as will be seen, can be used to couple the probe card assembly 1500 to a test system. (The coupling arms 1518 can be examples of coupling mechanisms.) The frame 1508 can also function as a stiffener structure to stiffen the probe card assembly 1500 in the "z" direction. The frame 1508 can comprise a metal plate. As discussed above and shown in FIG. 16, the frame 1508 can include cut outs 1616 for the interposers 1618.

As shown in FIG. 16 and mentioned above, alignment features 1612 and constraints 1624 can couple the wiring substrate 1506 and the frame 1508 according to some embodiments of the invention. In some embodiments, the alignment features 1612 can extend from a surface 1650 of the wiring substrate 1506, which can be the same surface 1650 that the terminals 1614 are disposed on. The corresponding constraints 1624 can be in a surface 1652 of the frame 1508 that faces the surface 1650 of the wiring substrate 1506. Each of the alignment features 1612 can be like the alignment feature 106 in FIG. 1, and each of the constraints 1624 can be like the constraint 206. For example, each of the constraints 1624 can be implemented as the constraint 406 of FIGS. 4, 5, and 6 including but not limited to the example of the constraint 706 in FIGS. 7 and 8. As another example, each of the constraints 1624 can be implemented as the constraint 906 of FIGS. 9 and 10 including but not limited to the example of the constraint 906 shown as the constraint 1306 in FIGS. 13 and 14. Moreover, the alignment features 1612 can be non-compliant (stiff). Alternatively, the alignment features 1612 can be compliant and the corresponding constraints 1624 can be non-compliant.

As mentioned, the alignment features 1612 and the constraints 1624 can be positioned to align the terminals 1614 on the wiring substrate 1506 with the spring interconnects 1626 extending from the interposers 1618 biased against bumps 1650 in the cut outs 1616 of the frame 1508. The wiring substrate 1506 can thus be an example of the first device 100 in FIGS. 1, 2, and 4, and the terminals 1614 on the wiring substrate 1506 can be an example of the first elements 104 of FIGS. 1, 2, and 4. The frame 1508 with interposers 1618 biased against bumps 1650 in the cut outs 1616 can thus be an example of the second device 200 in FIGS. 1, 2, and 4, and the spring interconnections 1626 extending from the interposers 1618 can be an example of the second structures 106 of FIGS. 1, 2, and 4.

That is, the alignment features 1612 can be positioned in predetermined locations on the surface 1650 of the wiring substrate 1506 with respect to the terminals 1614, and the constraints 1624 can be positioned in predetermined locations on the surface 1652 of the frame 1508 with respect to the spring interconnects 1626 such that when the alignment features 1612 are inserted into the constraints 1624, the terminals 1614 align with the spring interconnects 1626 in a plane that is generally parallel with the surface 1650 of the wiring substrate 1506 and the surface 1652 of the frame 1508 (e.g., the "x,y" plane in FIG. 16).

Moreover, as shown in FIG. 16, the constraints 1624 can include flexures 1660, which can be like and can serve any of the purposes of the flexures 212 discussed above. For example, the flexures 1660 can flex to allow the constraint 1624 to receive an alignment feature 1612 that is larger (intentionally or through a manufacturing error as discussed above) than the constraint 1624 as generally discussed above with respect to constraints 206. As another example, the flexures 1660 can accommodate errors in the position of one or more of the alignment features 1612 and/or the constraints 1624. That is, the flexures 1660 of each constraint 1624 can allow the alignment feature 1612 inserted in the constraint 1624 to move at least a small amount within the constraint 1624 to accommodate at least small errors in the actual positions of the alignment features 1612 and/or the constraints 1624 from the intended positions as generally discussed above. As discussed above, if the number of alignment features 1612 and constraints 1624 over constrains the wiring substrate 1506 and the frame 1508, the flexures 1660 can average such positional errors and thus typically result in a smaller overall error in the position of the terminals 1614 on the wiring substrate 1506 with respect to the spring interconnects 1626 extending from the interposers 1618 in the openings in the frame 1508 than the sum of all of the positional errors of the alignment features 1612 and the constraints 1624.

Figure 17:
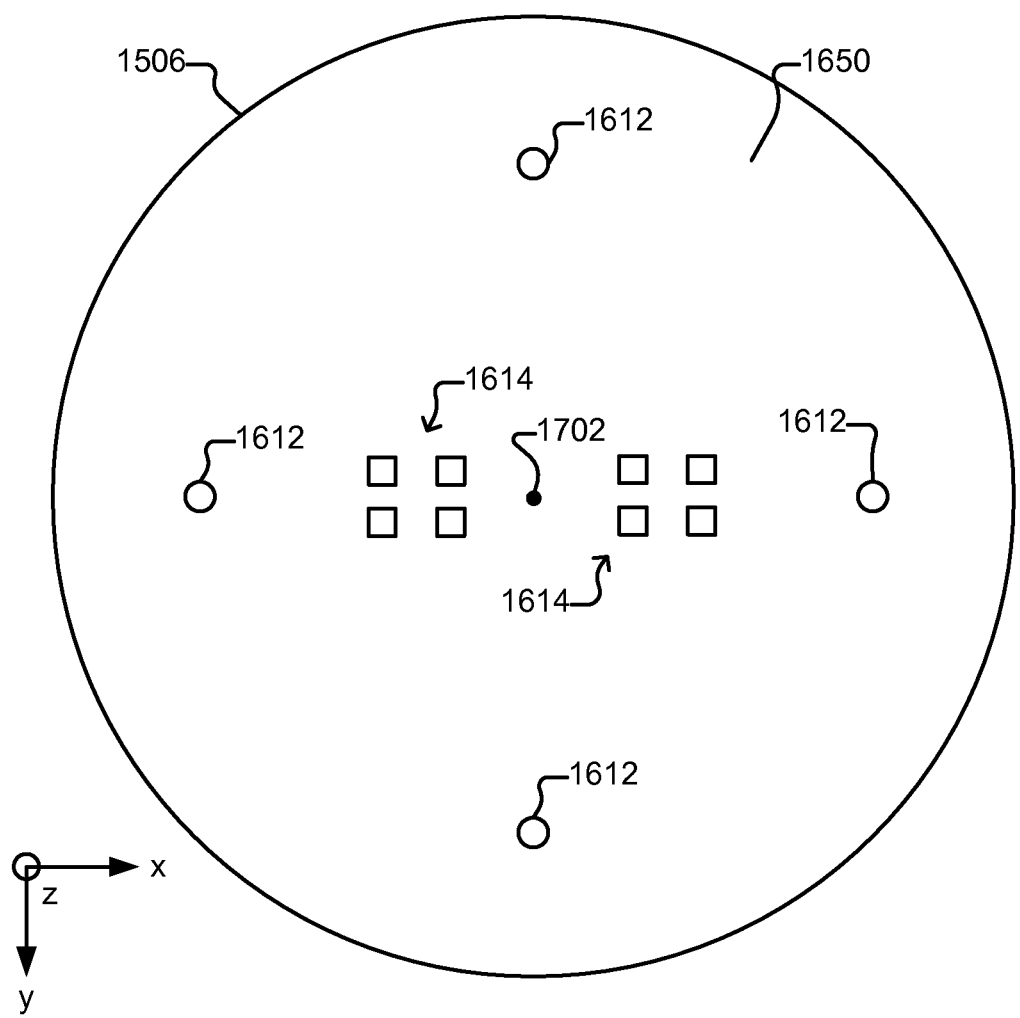
FIG. 17 illustrates a bottom view of the wiring substrate of the probe card assembly of FIG. 15 according to some embodiments of the invention.
Figure 18:
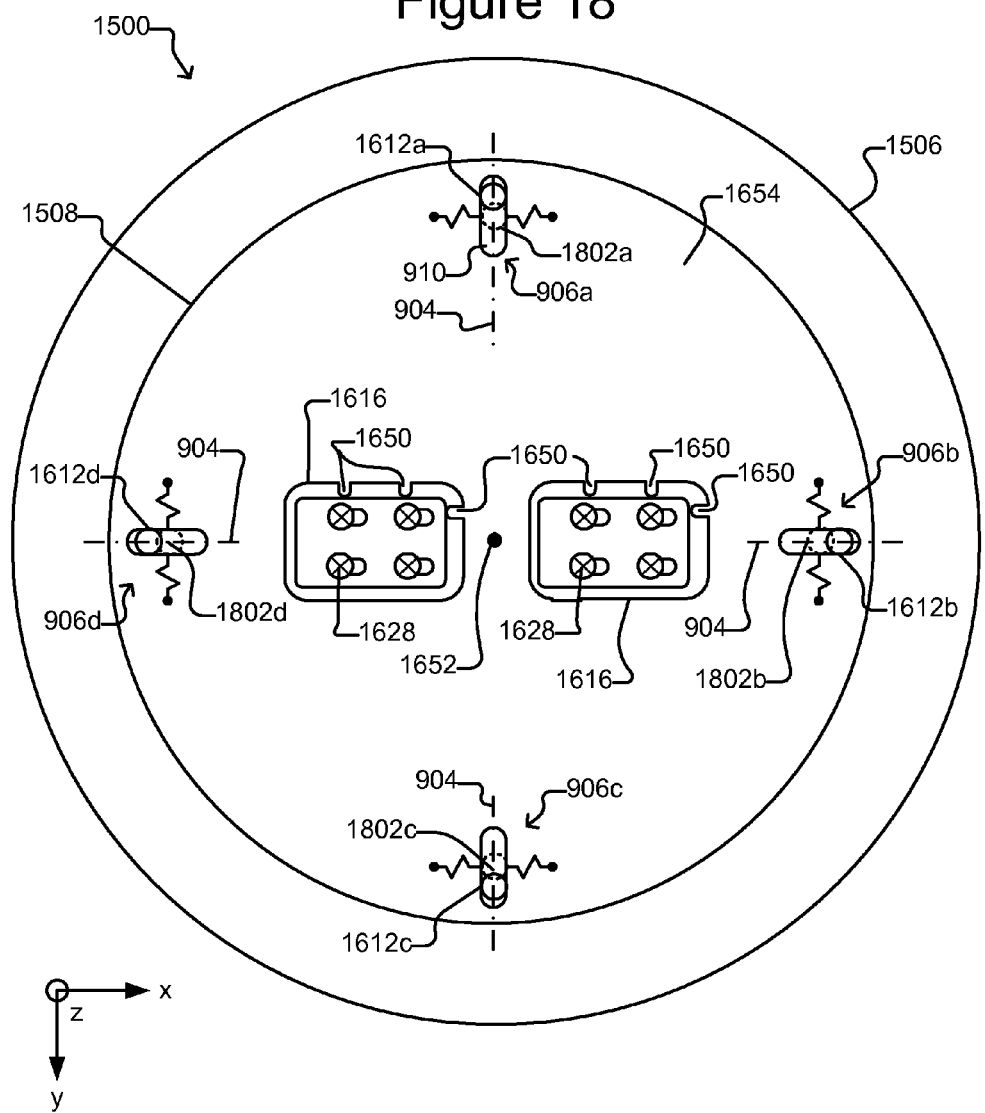
FIG. 18 illustrates a bottom view of the wiring substrate coupled to the frame 1508 of the probe card assembly of FIG. 15 according to some embodiments of the invention.

As mentioned, the constraints 1624 can be implemented as the constraints 906 in FIG. 9. FIGS. 17 and 18 illustrate an example of the probe card assembly 1500 in which constraints 1624 are implemented as the constraints 906 and oriented in accordance with the principles shown in FIGS. 11A and 11B to keep a location 1702 on the wiring substrate 1506 aligned with a location 1652 on the frame 1508 even as the wiring substrate 1506 expands or contracts radially from the location 1702 with respect to the frame 1508 and/or as the frame 1508 expands or contracts radially from the location 1652 with respect to the wiring substrate 1506. FIG. 17 illustrates a bottom view of the wiring substrate 1506, and FIG. 18 shows a bottom view of the frame 1508 and the wiring substrate 1506 coupled by the alignment features 1612 and the constraints 906.

As shown in FIG. 17, the alignment features 1612 can extend from the bottom surface 1650 of the wiring substrate 1506, and the alignment features 1612 can be positioned in predetermined locations with respect to the terminals 1614. As discussed above, the frame 1508 can include cut outs 1616 for interposers 1618. The cut outs 1616 can include bumps 1650 for positioning the interposers 1618 within the openings 1618 such that the spring interconnects 1626 extending between an interpose body 1632 and the terminals 1614 on the wiring substrate 1506 are positioned in predetermined locations with respect to the constraints 906 in the surface 1654 of the frame 1508. For example, an interposer 1618 can be positioned in the cut outs 1616 by pressing the interposer 1618 against the bumps 1650. Springs (not shown) on an interposer 1618 and/or the frame 1508 can bias the interposer 1618 against the bumps 1650.

As discussed above with respect to FIG. 9, each constraint 906 can include an opening 910 for receiving a corresponding alignment feature 1612. As also discussed above, the opening 910 can be configured to allow an alignment feature 1612 to move in one or more directions in the opening 910. As discussed above with respect to FIGS. 9, 11A, and 11B, the group of constraints 906 can be configured such that the group of constraints 906, as a whole, limits movement of each alignment feature 1612 to a single degree of movement, which is represented in FIG. 18 by axes 904. That is, movement of an alignment feature 1612 in an opening 910 is limited to movement along the axis 904. As shown in FIG. 18, the group of all the constraints 906 can be positioned such that all of the axes 904 are directed at a location 1652 on the frame 1508 and a corresponding location 1702 on the wiring substrate 1506 while the alignment features 1612 are inserted into the constraints 906. In some embodiments, the location 1702 can be a centroid of the terminals 1614 on the wiring substrate 1506, and the location 1652 can be a centroid of the spring interconnects 1626 of the interposers 1618 while each interposer 1618 is positioned against the bumps 1650 in the cut outs 1616 in the frame 1508. The alignment features 1612 and constraints 906 can allow relative expansion or contraction of the wiring substrate 1506 and the frame 1508 radially in the "x,y" plane with respect to locations 1702 and 1652 while impeding rotation of the wiring substrate 1506 and/or the frame 1508 about the "z" axis. This can keep the locations 1702 and 1652 generally aligned and also keep the terminals 1614 on the wiring substrate 1506 and the spring interconnects 1626 of the interposers 1618 in the cut outs 1616 in the frame aligned.

Moreover, in accordance with the discussion of FIG. 11B above, as the wiring substrate 1506 and the frame 1508 expand or contract relative to each other, the constraints 906 tend to keep the locations 120 and 220 aligned. For example, FIG. 18 illustrates an example in which alignment features 1612a, 1612b, 1612c, and 1612d have moved from initial positions 1802a, 1802b, 1802c, and 1802d due to expansion of the wiring substrate 1506 with respect to the frame 508. Because the constraints 906a and 906c constrain (i.e., impede) movement of the alignment features 1612a and 1612c in the "x" direction in FIG. 18 (as discussed above), the constraints 906a and 906c will tend to keep the alignment features 1612*b* and 1612*d* centered about the location 1702 even as the alignment features 1612*b* and 1612*d* move in the "x" direction within the constraints 906*b* and 906*d*. Likewise, because the constraints 906*b* and 906*d* constrain (i.e., impede) movement of the alignment features 1612*b* and 1612*d* in the "y" direction in FIG. 18, the constraints 906*b* and 906*d* will tend to keep the alignment features 1612*a* and 1612*c* centered about the location 1652 even as the alignment features 1612*a* and 1612*c* move in the "y" direction within the constraints 906*a* and 906*c*. Thus, as the wiring substrate 1506 expands and contracts with respect to the frame 1508 (or vice versa), the constraints 906*a*, 906*b*, 906*c*, and 906*d* keep the alignment features 1612*a*, 1612*b*, 1612*c*, and 1612*d* centered about the location 1702 and thus keep the locations 1702 and 1652 on the wiring substrate 1506 and the frame 1508 aligned during such expansion or contraction. Keeping the locations 1702 and 1652 aligned also keeps the terminals 1614 on the wiring substrate 1506 and the spring interconnects 1626 on the interposers 1618 in the cut outs 1616 in the frame 1508 aligned at least over a particular temperature range.

The configurations of the alignment features 1612 and the constraints 1624 shown in FIGS. 17 and 18 are examples only, and variations are possible. For example, the constraints 906 can be positioned such that the axes 904 are directed at something other than the location 1652. For example, generally as shown in FIG. 12, the axes 904 of each of the constraints 906 can be oriented in a particular direction (e.g., along the "x" axis in the example shown in FIG. 12). In such a case, relative movement due to thermal expansion or contraction between the wiring substrate 1506 and the frame 1508 will be in the particular direction (e.g., along the "x" axis in the example of FIG. 12). Motion can thus be created between the wiring substrate 1506 and the frame 1508. As another example, generally as discussed above with respect to the alignment features 106 and the constraints 206 of FIGS. 1-3, the alignment features 1612 can be compliant rather than stiff, and in such embodiments, the constraints 1624 can be compliant or alternatively can be stiff (e.g., the constraints 1624 may lack flexures 1660). As yet another example, the alignment features 1612 can extend from the surface 1652 of the frame 1508, and the constraints 1624 can be in the surface 1650 of the wiring substrate 1506.

As mentioned above, second alignment features 1682 can extend from the surface 1694 of the wiring substrate 1506 and mate with second constraints 1684 in the stiffener 1502, which can include flexures 1692. Otherwise, the second alignment features 1682 can be like the alignment features 1612 including any embodiment, configuration, or variation of the alignment features 1612 describe herein. The second constraints 1684 can similarly be like the constraints 1624 including any embodiment, configuration, or variation of the constraints 1624 described herein, and the flexures 1692 can be like the flexures 1660 including any embodiment, configuration, or variation of the flexures 1660 described herein. The second alignment features 1682 and the second constraints 1684 can be disposed in the generally the same or similar patterns as the alignment features 1612 and the constraints 1624 to achieve the same alignment, error correction, and directed thermal movements as the alignment features 1612 and the constraints 1624. As mentioned above, each of the alignment features 1612 can comprise a pin that extends from the surface 1652 of the wiring substrate 1506. In some such an embodiments, each such pin can also extend through the wiring substrate 1506 and away from the opposite surface 1694 of the wiring substrate 1506, and each of the alignment features 1682 can comprise the portion of the pin that extends from the surface 1694.

Figure 19:
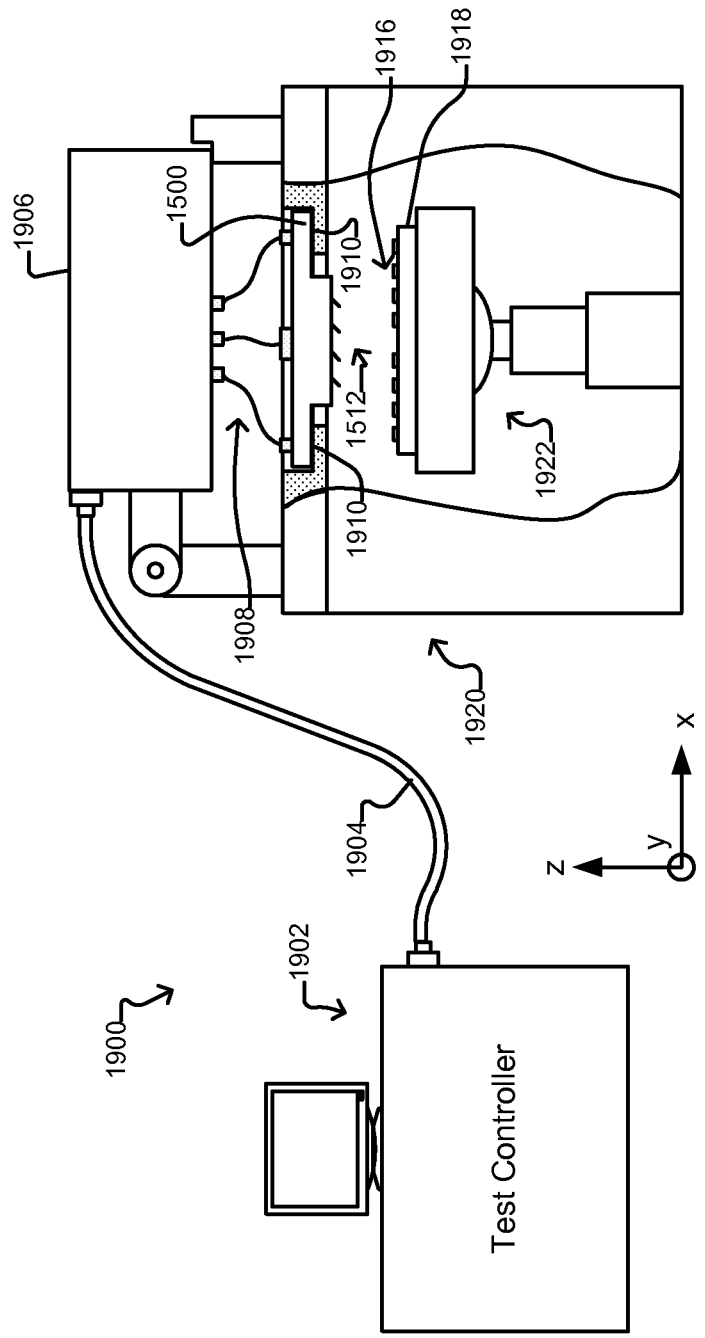
FIG. 19 illustrates an example of a test system in which the probe card assembly of FIG. 15 can be used according to some embodiments of the invention.

The probe card assembly 1500 of FIG. 15 can be used to test electronic devices. FIG. 19 illustrates an example of a test system 1900 in which the probe card assembly 1500 can be used to test DUTs 1918. The acronym "DUT" can mean "device under test," which can be any electronic device including without limitation semiconductor dies (singulated or in wafer form, packaged or unpackaged). As shown, the test system 1900 can include a test controller 1902, which can provide input signals to the DUTs 1918 and can receive response signals generated by the DUTs 1918 in response to the input signals. The term "test signals" can refer generically to either or both the input signals generated by the test controller 1902 and the response signals generated by the DUTs 1918. The probe card assembly 1500 can be attached to a mounting surface 1910 of a housing 1920 (e.g., a prober) of the test system 1900. The probes 1512 of the probe card assembly 1500 can make pressure-based electrical connections with terminals 1916 of the DUTs 1918, and the test signals can be passed between the test controller 1902 and the DUTs 1918 through a connection 1904 (e.g., a coaxial cable, a wireless link, a fiber optic link, etc.), electronics (not shown) in a test head 1906, connectors 1908 between the test head 1906 the probe card assembly 1502, and the probe card assembly 1500. (Connectors 1908 can be an example of an electrical interface to the test controller 1902, and the DUTs 1918 can be an example of electronic devices being tested under control of the test controller 1902.) As shown, the probe card assembly 1500 can be coupled to the mounting surface 1910 of the housing 1920, which can include a movable chuck 1922 on which the DUTs 1918 are disposed. The DUTs 1916 can be tested as follows. The probe card assembly 1500 can be coupled to the mounting surface 1910 of the housing 1920, and terminals 1916 of the DUTs 1918 can be brought into contact with the probes 1512 of the probe card assembly 1500. This can be accomplished by moving the chuck 1922 such that terminals 1916 of the DUTs 1918 are pressed against probes 1512 of the probe card assembly 1500. Alternatively, the probe card assembly 1500 can be moved, or both the chuck 1922 and the probe card assembly 1500 can be moved to effect contact between the terminals 1916 and the probes 1512.

While the probes 1512 and terminals 1916 are in contact, the DUTs 1918 can be tested by providing test signals (which, as discussed above, can include input signals generated by the test controller 1902, and response signals generated by the DUTs 1918 in response to the input signals) between the test controller 1902 and the DUTs 1918 through the probe card assembly 1500. The test controller 1902 can analyze the response signals to determine whether the DUTs 1918 pass the testing. For example, the test controller 1902 can compare the response signals to expected response signals. If the response signals match the expected response signals, the test controller 1902 can determine that the DUTs 1918 passed the testing. Otherwise, the test controller 1902 can determine that the DUTs 1918 failed the testing. As another example, the test controller 1902 can determine whether the response signals are within acceptable ranges, and if so, can determine that the DUTs 1918 passed the testing.

While testing the DUTs 1918 as described above, the alignment features 1612 and the constraints 906 can allow relative expansion or contraction between the wiring substrate 1506 and the frame substrate 1508. Such relative expansion or contraction can be radially from the location 1702 on the wiring substrate 1506 and the location 1652 on the frame 1508. Moreover, the alignment features 1612 and the constraints 906 can do so while keeping the locations 1702 and 1652—and thus the terminals 1614 on the wiring substrate 1506 and the spring interconnects 1626 of the interposers 1618—aligned.

Figure 20:
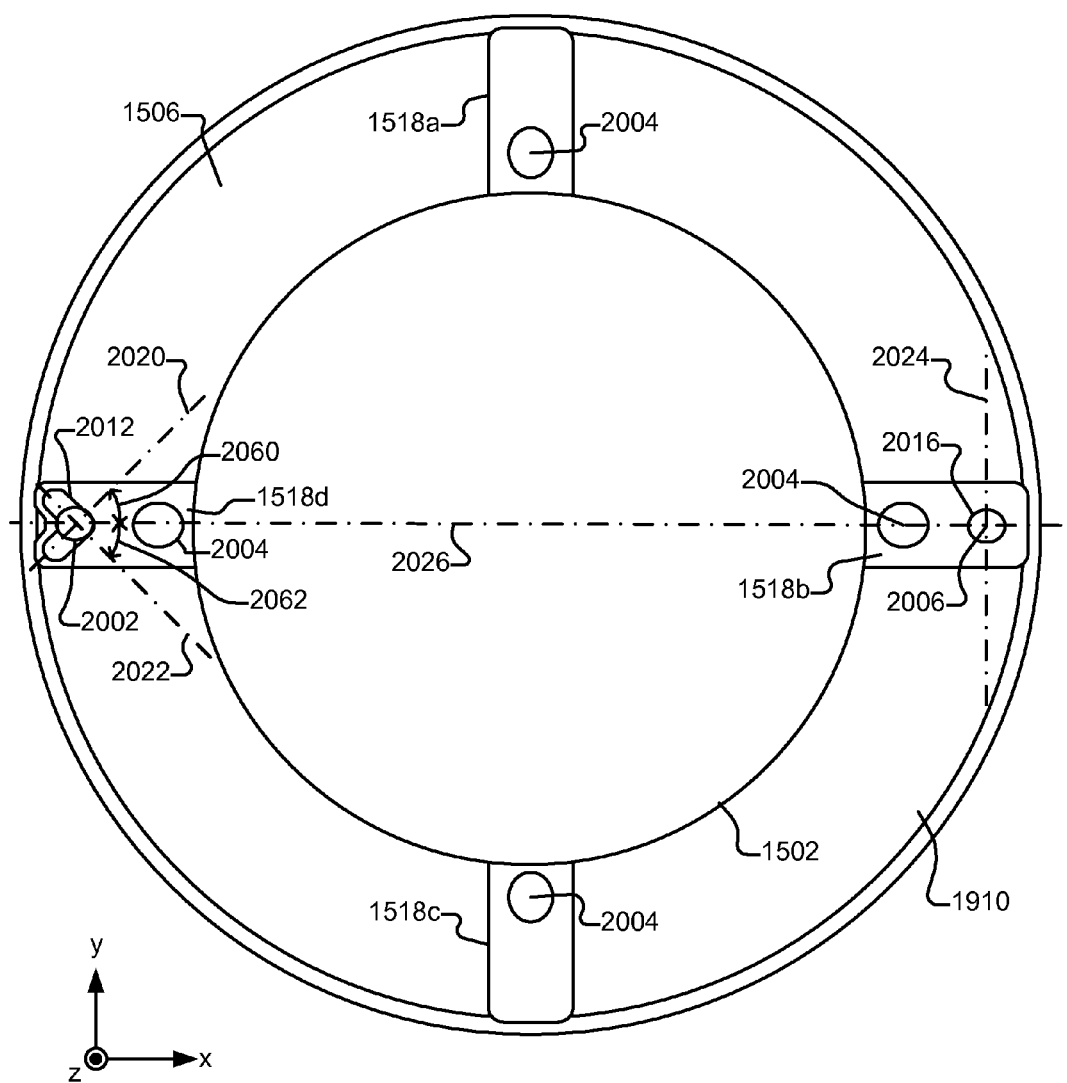
FIG. 20 illustrates a top view of the probe card assembly of FIG. 15 coupled to a mounting surface of test system of FIG. 19 according to some embodiments of the invention.
Figure 21:
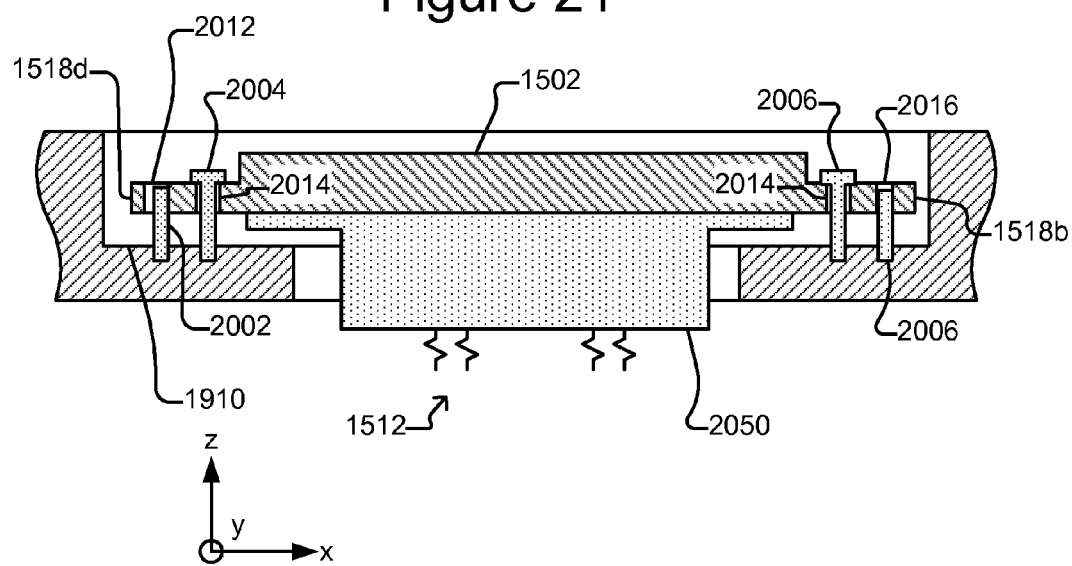
FIG. 21 illustrates a simplified, side, cross-sectional view of the probe card assembly and mounting surface of FIG. 20 according to some embodiments of the invention.

Alignment features and constraints can be used to couple the probe card assembly 1500 to the mounting surface 1910 of the housing 1920 in FIG. 19. FIGS. 20 and 21 illustrate an example. FIG. 20 shows a top view of the probe card assembly 1500 coupled to a typical mounting surface 1910, and FIG. 21 shows a simplified, cross-sectional side view of the probe card assembly 1500 and mounting surface 1910. For ease of illustration and to simplify the depiction, the wiring substrate 1506, frame 1508, interposers 1616, and probe substrates 1510 are not separately shown in FIG. 21 but are depicted generically as element 2050.

As shown, alignment features 2002 and 2006 (which can be like alignment features 106 in FIG. 1 and 1612 in FIG. 16) can extend from the mounting surface 1910. In the example shown in FIGS. 20 and 21, the stiffener 1502 is illustrated with four coupling arms 1518a, 1518b, 1518c, and 1518d, although the stiffener 1502 can have more or fewer coupling arms. Some of the coupling arms 1518 can include constraints 2012 and 2016 each configured to receive one of the alignment features 2002 and 2006. The alignment features 2002 and 2006 can be positioned on the mounting surface 1910 and the corresponding constraints 2012 and 2016 can be positioned on the coupling arms 1502 so that the probe card assembly 1500 is in a predetermined location with respect to the mounting surface 1910—and thus the housing 1920 and chuck 1922 and/or DUTs 1918 within the housing 1920—while the alignment features 2002 are inserted into the constraints 2012 and 2016.

In some embodiments, the alignment features 2002 and 2006 and constraints 2012 and 2016 can be configured to kinematically constrain in a plane that is generally parallel to the mounting surface 1910 (the "x,y" plane in FIGS. 20 and 21) (hereinafter the "x,y" plane) the probe card assembly 1500 with respect to the mounting surface 1910. (In other embodiments, the probe card assembly 1500 and the mounting surface 1910 can be constrained by elastic averaging.) By definition, a body is kinematically constrained if (1) the number of constraints equals the number of degrees of freedom of movement of the body, and (2) the constraints constrain the body along constraint lines no two of which are coincident. In the "x,y" plane, the probe card assembly 1500 has three degrees of freedom of movement: (1) translation along the "x" axis, (2) translation along the "y" axis, and (3) rotation about the "z" axis. Thus, to kinematically constrain the probe card 1500 in the "x,y" plane, the alignment features 2002 and constraints 2002 and 2006 must constrain the stiffener 1502 along three non-coincident constraint lines.

As shown in FIG. 20, the constraint 2016 can be configured to receive alignment feature 2006 and constrain movement of the coupling arm 2018b—and thus the probe card assembly 1500—along a constraint line 2024 that is generally perpendicular to an axis 2026 of the constraints 2012 and 2016 (e.g., a line that crosses centers of the constraints 2016 and 2016). (The coupling arm 1518b can be an example of a first coupling mechanism, the constraint 2016 can be an example of a first constraint, and the alignment feature 2006 can be an example of a first alignment feature.) As also shown in FIG. 20, the constraint 1502 can be configured to receive alignment feature 2002 and constrain movement of the coupling arm 2018d—and thus the probe card assembly 1500—along two non-parallel constraint lines 2020 and 2022 that are neither parallel nor perpendicular to the constraint line 2024. (The coupling arm 1518d can be an example of a second coupling mechanism, the constraint 2012 can be an example of a second constraint, and the alignment feature 2002 can be an example of a second alignment feature.) An angle 2060 between the constraint line 2020 and the axis 2026 can be any value (e.g., any integer or non-integer real value) that is greater than zero but less than ninety degrees (e.g., an acute, non-zero angle), and the angle 2062 between the constraint line 2022 and the axis 2026 can also be any value (e.g., any integer or non-integer real value) greater than zero but less than ninety degrees (e.g., an acute, non-zero angle). In some embodiments, the angle 2060 can be within any of the following ranges of angles: ten to eighty degrees; fifteen to seventy-five degrees; twenty to seventy degrees; twenty-five to sixty-five degrees; thirty to sixty degrees; thirty-five to fifty-five degrees; or forty to fifty degrees. The angle 2062 can also be within any of the following ranges of angles: ten to eighty degrees; fifteen to seventy-five degrees; twenty to seventy degrees; twenty-five to sixty-five degrees; thirty to sixty degrees; thirty-five to fifty-five degrees; or forty to fifty degrees. The size of angles 2060 and 2062 can be equal or approximately equal. Alternatively, the size of the angles 2060 and 2062 can different.

Figure 22:
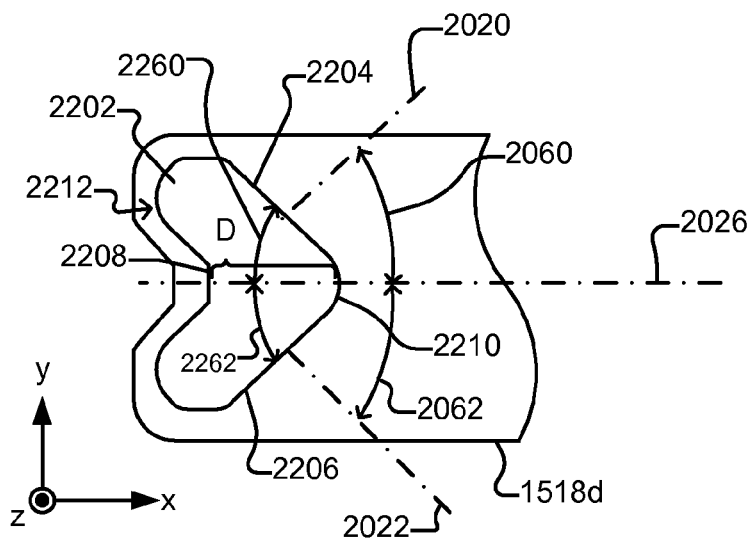
FIG. 22 illustrates an example of a constraint on one of the coupling arms of the probe card assembly of FIGS. 21 and 20 according to some embodiments of the invention.
Figure 23:
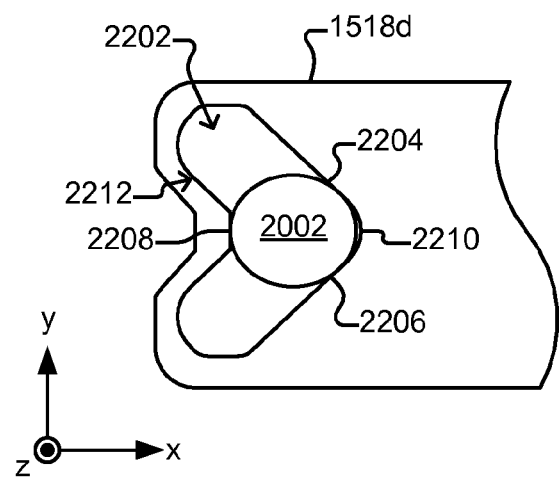
FIG. 23 illustrates an alignment feature in the constraint of FIG. 22 according to some embodiments of the invention.
Figure 24:
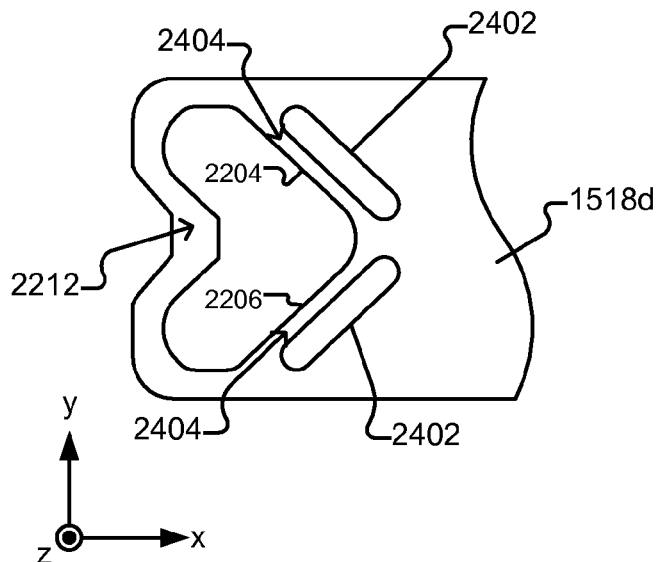
FIG. 24 illustrates the constraint of FIG. 22 with slots according to some embodiments of the invention.

FIG. 22 illustrates an example of a constraint 2012 in the form of constraint 2212. As shown, the constraint 2212 can include a generally "V" shaped opening 2202 in the coupling arm 1518d. The perimeter of the opening 1518d can include a first constraining portion 2204 (which can be a first constraining wall) that is generally perpendicular to the constraining line 2020 and a second constraining portion 2206 (which can be a second constraining wall) that is generally perpendicular to the constraining line 2022. The first constraining portion (or wall) 2204 can thus be oriented at an angle 2260 with respect to the axis 2026 that is equal to the angle 2060 as shown in FIG. 22, and the second constraining portion (or wall) 2206 can thus be oriented at an angle 2262 with respect to the axis 2026 that is equal to the angle 2062 as also shown in FIG. 22. The perimeter of the opening 2202 can also include a third portion (or sidewall) 2208 that joins the first constraining portion (or wall) 2204 and the second constraining portion (or wall) 2206, and the perimeter of the opening 2202 can also include a fourth portion (or sidewall) 2210 disposed a distance D from the third portion 2208. The distance D can be equal or approximately equal to a dimension of the alignment feature 2002 (e.g., a diameter if the alignment feature is cylindrical) so that the alignment feature 2002 can be inserted into the opening 2202 between the first, second, third, and fourth portions 2004, 2006, 2008, and 2010 of the perimeter of the opening 2202 as shown in FIG. 23 such that the alignment feature 2002 contacts at least the first constraining portion (or wall) 2004 and the second constraining portion (or wall) 2006. The distance D can alternative be smaller than the dimension of the alignment feature 2002, and the opening 2202 can be flexible to receive the larger alignment feature 2002. In fact, as shown in FIG. 24, slots 2402 can be provided in the coupling arm 1518d adjacent the first constraining portion (or wall) 2204 and the second constraining portion (or wall) 2206 forming flexures 2404 between each of the first constraining portion 2204 and the second constraining portion 2206 and the slots 2402 as shown in FIG. 24. The slots 2402 can be elongate holes in the coupling arm 1518d. The slots 2402 can be generally like slots 1308 in FIG. 13, and flexures can be generally like the flexures 1312 in FIG. 13.

Figure 25:
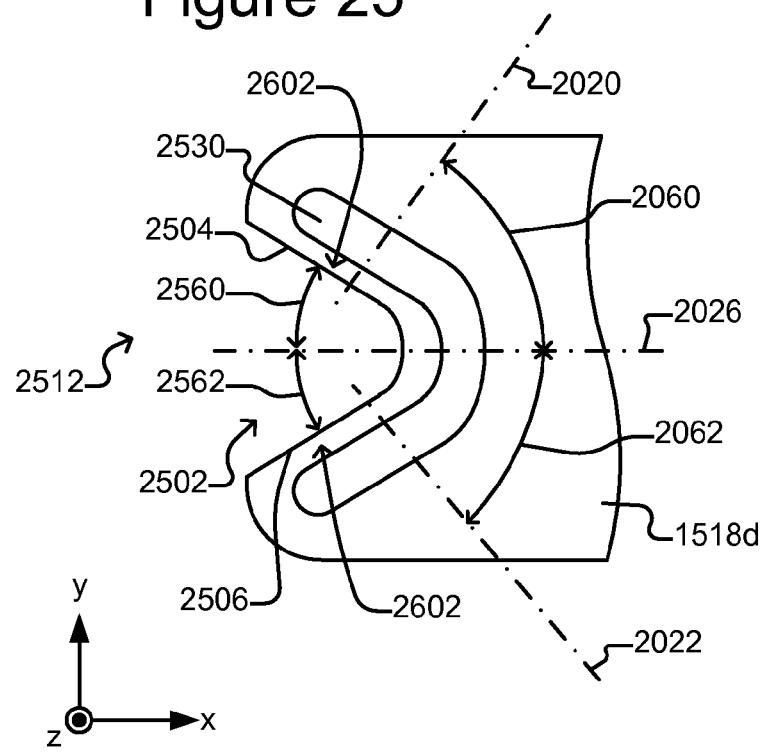
FIG. 25 illustrates another example of a constraint on one of the coupling arms of the probe card assembly of FIGS. 21 and 20 according to some embodiments of the invention.

FIG. 25 illustrates an example of a constraint 2012 in the form of constraint 2512. As shown, the constraint 2512 can include a generally "V" shaped cut-out 2502 at an end of the coupling arm 1518d. The cut-out 2502 can include a first constraining wall 2504 that is generally perpendicular to the constraining line 2020 and a second constraining wall 2506 that is generally perpendicular to the constraining line 2022. The first constraining wall 2504 can thus be oriented at an angle 2560 with respect to the axis 2026 that is equal to the angle 2060 as shown in FIG. 25, and the second constraining wall 2506 can thus be oriented at an angle 2562 with respect to the axis 2026 that is equal to the angle 2062 as also shown in FIG. 25. The cut-out 2502 can be sized so that the alignment feature 2002 can contact both the first constraining wall 2504 and the second constraining wall 2506 as shown in FIG. 26.

Figure 26:
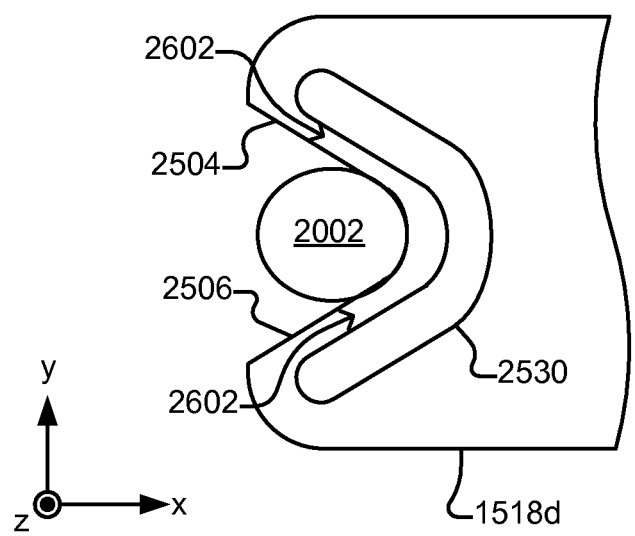
FIG. 26 illustrates an alignment feature in the constraint of FIG. 25 according to some embodiments of the invention.

As shown in FIGS. 25 and 26, one or more slots 2530 can be provided in the coupling arm 1518*d* adjacent the first constraining wall 2504 and the second constraining wall 2506 forming flexures 2602 between each of the first constraining wall 2504 and the second constraining wall 2506 and the one or more slots 2502 as shown in FIGS. 25 and 26. The one or more slots 2530 can be one or more elongate holes in the coupling arm 1518*d*. The one or more slots 2530 can be generally like slots 1308 in FIG. 13, and flexures 2602 can be generally like the flexures 1312 in FIG. 13.

Referring again to FIGS. 20 and 21, the constraint 2016 can be implemented as a simple hole in the coupling arm 1518*b*. Alternatively, the constraint 2006 can be implemented as the constraint 206 in FIG. 2, the constraint 406 in FIG. 4, the constraint 706 in FIG. 7, the constraint 906 in FIG. 9, or the constraint 1306 in FIG. 13. If the constraint 2016 is implemented as the constraint 1306 in FIG. 13, the axis 1316 along the length of the elongate opening 1310 can be along the axis 2026 in FIG. 20.

The configuration of the probe card assembly 1500 coupled to the mounting surface 1910 shown in FIGS. 20 and 21 is an example only, and variations are possible. For example, the stiffener 1502 can have more or fewer coupling arms 1518 than shown in FIG. 20. As another example, the constraint 2002 (e.g., implemented as the constraint 2212 in FIG. 22 or FIG. 24 or the constraint 2512 in FIG. 25) can be implemented in more than one of the coupling arms 1518, and/or the constraint 2006 can be implemented in more than one of the coupling arms 1518. In such a case, the stiffener 1502—and thus the probe card assembly 1500—will be over constrained with respect to the mounting surface 1910. As generally discussed above, the constraint(s) 2002 and the constraint(s) 2006 can elastically average errors in the positions of one or more of the alignment features 2002 and 2006 and/or one or more of the constraints 2012 and 2016.

The probe card assembly 1500 and the mounting surface 1910 are examples only, and the alignment features 2002 and 2006 and the corresponding constraints 2012 and 2016 (including any variation or embodiment described herein) can couple and align other devices. Indeed, alignment features 2002 and 2006 can be on a first device, apparatus, or structure, and constraints 2012 and 2016 can be on a second device, apparatus, or structure. The alignment features 2002 and 2006 and the constraints 2012 and 2016 can couple the first device apparatus, or structure to the second device, apparatus, or structure in the same way that alignment features 2002 and 2006 and the constraints 2012 and 2016 can couple the stiffener 1502 (which includes the coupling arms 1518) to the mounting surface 1910 in FIGS. 20, 21, 22, 23, 24, 25, and 26. For example, the alignment features 2002 and 2006 (including any variation or embodiment describe herein) can replace any of the alignment features 106 in FIGS. 1 and 3, and the constraints 2012 and 2016 (including any variation or embodiment describe herein) can replace any of the constraints 206 in FIGS. 2 and 3. The alignment features 2002 and 2006 (including any variation or embodiment describe herein) can also replace any of the alignment features 1612 and 1682 in FIGS. 16-18, and the constraints 2012 and 2016 (including any variation or embodiment describe herein) can replace any of the constraints 1624 and 1684 in FIGS. 16-18.

Figure 27:
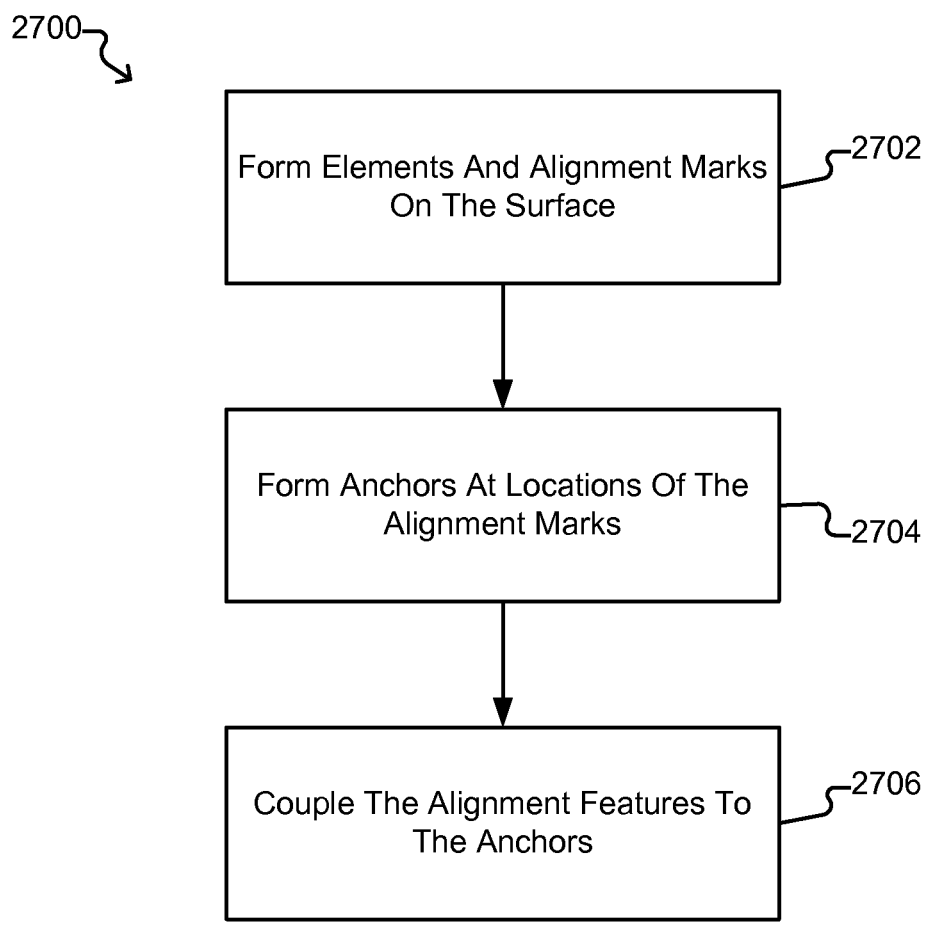
FIG. 27 illustrates a method for manufacturing the device of FIG. 1 according to some embodiments of the invention.

FIG. 27 shows an example of a process 2700 that can be used to position alignment features on a surface with respect to elements. For ease of illustration and discussion, the process 2700 is discussed below with respect to positioning the alignment features 106 of the first device 100 of FIG. 1, although the process 2700 is not so limited. The process 2700 of FIG. 27 can also be used to position the alignment features 1612 in FIG. 17.

Figure 28:
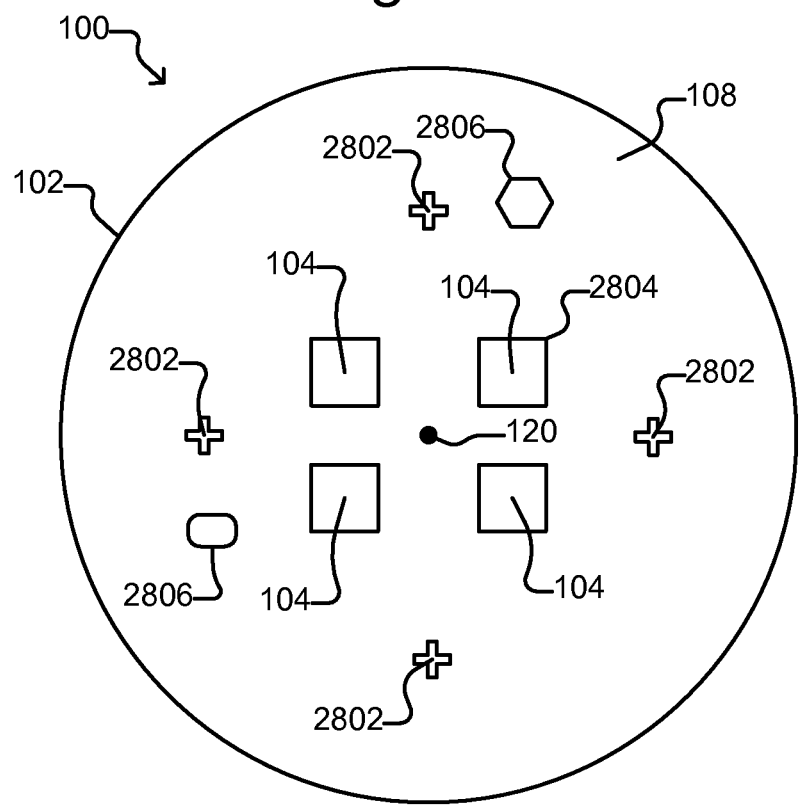
FIG. 28 illustrates a top view of the substrate of the device of FIG. 1 with the first elements and markers according to some embodiments of the invention.

Referring to FIGS. 27 and 28, at 2702 of FIG. 27, the first elements 104 and alignment marks 2802 can be formed on the surface 108 of the structure 102 of the first device 100 as shown in FIG. 28. In some embodiments, the structure 102 can be a wiring substrate such as a printed circuit board, and the first elements 104 can be electrically conductive terminals. In such an embodiment, the first elements 104 can be metal pads. Such metal pads can be formed on the surface 108 of the structure 102 using known techniques for forming metal pads on printed circuit boards. In such an embodiment, the alignment marks 2802 can be deposits of the metal and can be formed in the same process and with the same metal as the first elements 104. As is known, using such known processes, the alignment marks 2802 can be formed in precise locations with respect to the first elements 104. Thus, the alignment marks 2802 can be made of the same material, in the same process, and in the same way as the metal pads that constitute the first elements 106. In other words, the metal constituting the metal pads that constitute the first elements 106 and the metal that constitutes the alignment marks 2802 can be laid down on the surface 108 of the structure 102 in the same process and in the same way.

As will be seen, the location of the alignment marks 2802 can correspond to desired positions of the alignment features 106 extending from the first device 100 in FIG. 1. The alignment marks 2802 can be formed in precise locations with respect to the first elements 104. In some embodiments, each of the alignment marks 2802 can be located a precise distance and direction from a feature related to the first elements 104. For example, each of the alignment marks 2802 can be located a precise distance and direction from the centroid 120 of the first elements 104. In another example, each of the alignment marks 2802 can be located a precise distance and direction from a particular feature 2804 (e.g., a corner) of one of the first elements 104.

Figure 29:
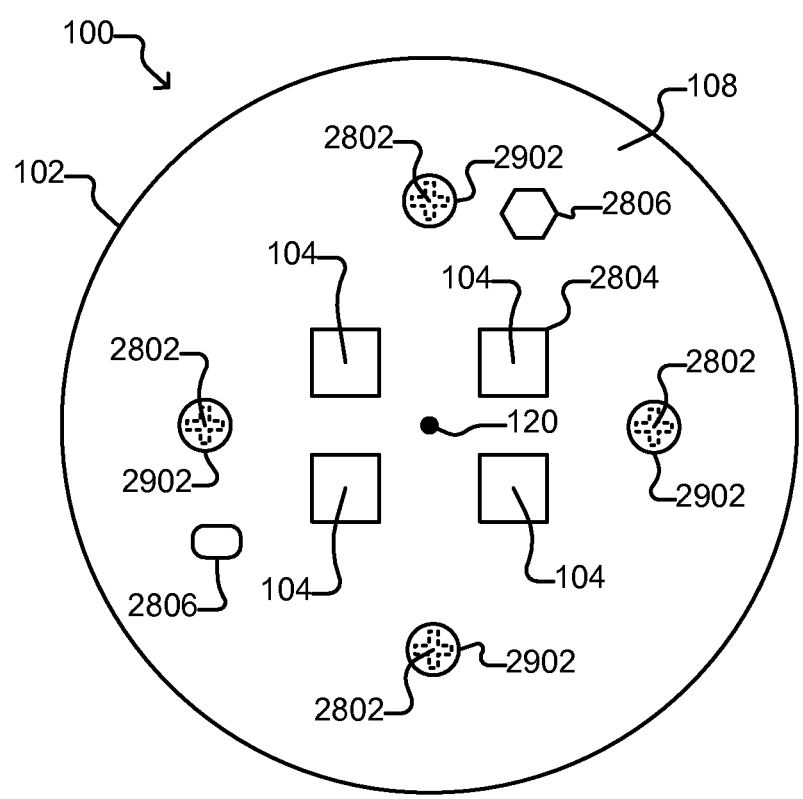
FIG. 29 illustrates the substrate of FIG. 28 with anchors for the alignment features of the first device of FIG. 1 according to some embodiments of the invention.

Referring to FIGS. 27 and 29, at 2704 of FIG. 27, anchors 2902 can be made in the surface 108 of the structure 102 of the first device 100 at locations on the surface 108 that correspond to the alignment marks 2802. For example, the anchors 2902 can be holes in the surface of the surface 102. Each hole can be formed by aligning a drill with one of the alignment marks 2802, and drilling with the drill a hole at the alignment mark 2802 into the structure 102. Optical alignment equipment can be used to align the drill with the each alignment mark 2802. Regardless of how the anchors 2902 are made, the anchors 2902 can be precisely positioned at the locations of the alignment marks and thus be precisely positioned with respect to the first elements 104.

Referring to FIG. 27, at 2706, the alignment features 106 can be coupled to the anchors 2902. If the anchors 2902 are holes drilled into the surface 108 of structure 102, the alignment features 104—which as discussed above, can be pins—can be inserted into and secured in the holes. The result can be alignment features 104 in precise locations with respect to the first elements 104 on the surface 108 of the structure 102 of the first device 100 as shown in FIG. 1.

The example shown in FIGS. 27-29 is not limiting, and variations are possible. For example, as shown in FIG. 28, one or more additional features 2806 can also be formed on the surface 108 at 2702 of the process 2700 of FIG. 27. Such additional features 2806 can be formed in precise locations with respect to the alignment marks 2802. The additional features 2806 can thus be made to align in a particular desired orientation with the second device 200 of FIGS. 2 and 3. The additional features 2806 can be or can correspond to any feature that is to align in a particular orientation with the second device 200. For example, the additional features 2806 can be circuit elements, mechanical components, etc. As another example, the additional features 2806 can be alignment marks, which can mark locations for attaching additional elements to the first device 100 that are to align in a particular orientation with the second device 200.

Figure 30:
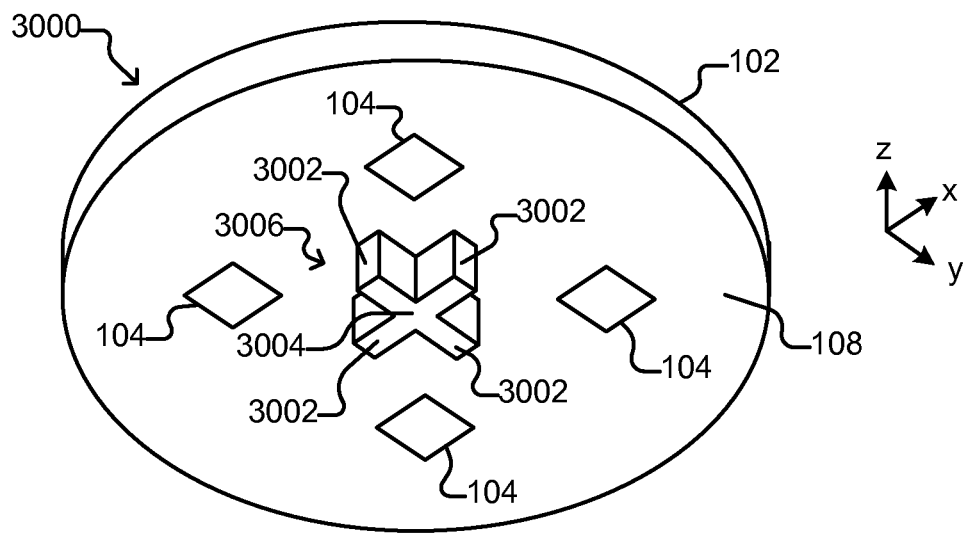
FIG. 30 illustrates the first device of FIG. 1 with another example of an alignment feature according to some embodiments of the invention.
Figure 31:
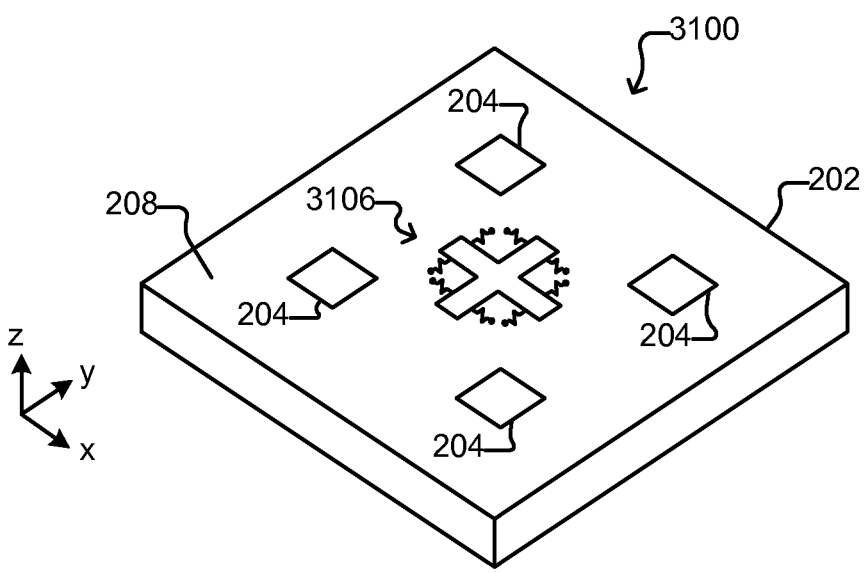
FIG. 31 illustrates the second device of FIG. 2 with another example of a constraint according to some embodiments of the invention.

FIGS. 30 and 31 illustrate variations of the first device 100 and the second device 200 of FIGS. 1-3 according to some embodiments of the invention. As shown in FIG. 30, the first device 3000 can be like the first device 100 except that the alignment features 106 of the first device 100 are replaced with the alignment feature 3006, which as shown can extend from the surface 108 of the structure 102. As shown in FIG. 31, the second device 3100 can be like the second device 200 of FIG. 2 except that the constraints 206 of the second device 200 are replaced with the constraint 3106. The alignment feature 3006 and the constraint 3106 can be positioned on the first device 3000 and the second device 3100, respectively, such that the first elements 104 on the first device 3000 align with the second elements 204 on the second device 3100 while the alignment feature 3006 is inserted into the constraint 3106.

As also shown, in some embodiments, the alignment feature 3006 can comprise multiple extensions 3002 that extend from a central region 3004. Although four such extensions 3002 are shown in FIG. 30 forming a "plus" (or cross) shape, more or fewer extensions 3002 can extend from the central region 3004, and/or the extensions 3002 can be arranged to form shapes other than a plus shape. The constraint 3106 can have a size and shape configured to receive the alignment feature 3006. As long as the alignment feature 3006 has at least three of the extensions 3002 none of which are parallel, the corresponding constraint 3106 can sufficiently constrain the alignment feature 3006 such that the first device 3000 is kinematically constrained (at least in the "x,y" plane) with respect to the second device 3100. If the alignment feature 3006 has more than three extensions 3002, the corresponding constraint 3106 can over constrain the alignment feature 3006 and thus the first device 3000 with respect to the second device 3100.

The alignment feature 3006 can be stiff, and the constraint 3106 can be compliant generally like, as discussed above, the alignment features 106 of FIG. 1 can be stiff, and the constraints 206 of FIG. 2 can be compliant. Alternatively, the alignment feature 3006 can be compliant like, as discussed above, the alignment features 106 can be compliant. In such a case, the constraint 3106 can be compliant or stiff.

FIG. 32 illustrates an example of the constraint 3106 in which the constraint 3106 is compliant. As shown in FIG. 32, the constraint 3106 can comprise an opening 3200 in the structure 202 of the second device 3100. The opening 3200 can comprise a central region 3204 and slots 3202 that extend from the central region 3204. In some embodiments, the slots 3202 can be generally rectangular (including square) as shown in FIG. 32. The slots 3202 can, however, have other shapes. The slots 3202 can extend completely through or partially into the structure 202 of the first device 3100. As shown, the constraint 3106 can include flexures 3206 that allow sidewalls 3210 of the opening 3200 to flex. Generally in accordance with discussions above, the flexures 3206 can allow the sidewalls 3210 to flex to receive the alignment feature 3006 even if the alignment feature 3006 is oversized (all or part of the alignment feature 3006 is larger than all or part of the opening 3200 of the constraint 3106) or there are one or more errors in the size, shape, or position of the alignment feature 3006 and/or the constraint 3106. Moreover, because the slots 3202 extend from the central region 3204, the alignment feature 3006 and the constraint 3106 can limit relative movement between the first device 3000 and the second device 3100 caused by relative expansion or contraction of the first device 3000 with respect to the second device 3100 (or vice versa) to radial expansion or contraction from the central region 3204. In some embodiments, the opening 3200 can have other shapes that limit relative thermal movement between the first device 3000 with respect to the second device 3100 to other movements (e.g., movements that are directed in a particular direction).

Figure 33:
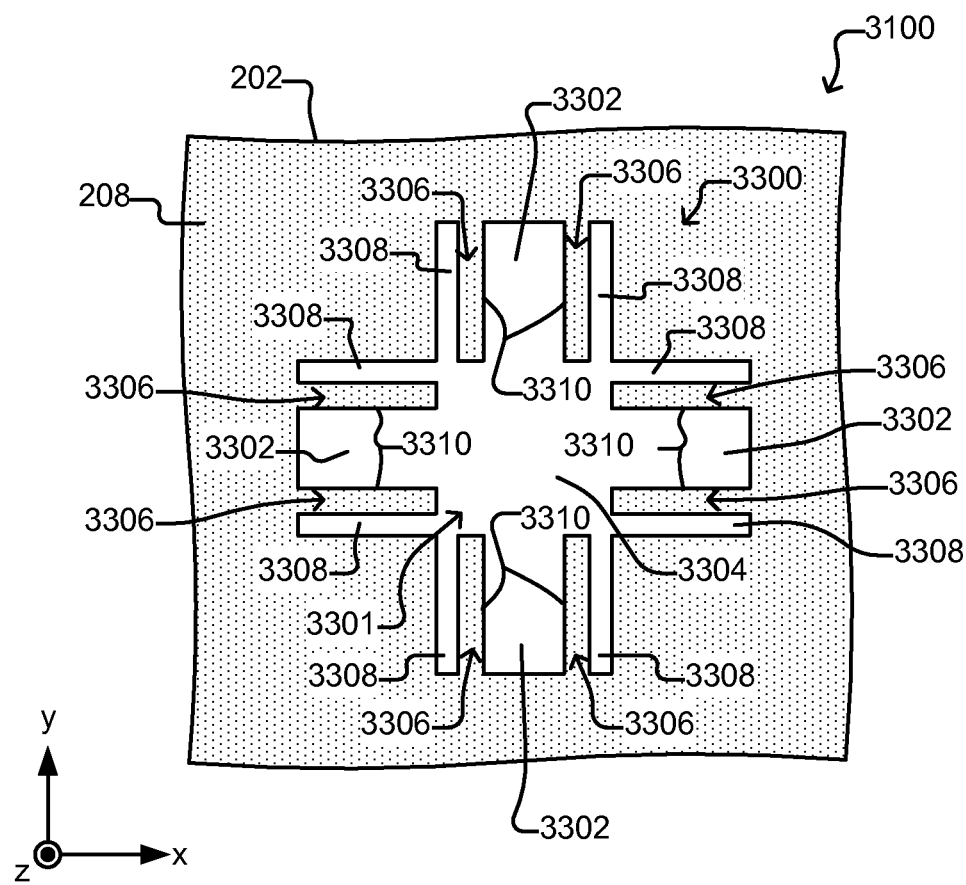
FIG. 33 illustrates a partial view of the second device of FIG. 31 with an example of an implementation of the constraint of FIG. 32 according to some embodiments of the invention.

FIG. 33 illustrates a constraint 3300 formed in the surface 208 of the second device 3100 that is an example of an implementation of the constraint 3106 of FIGS. 31 and 32 according to some embodiments of the invention. FIG. 33 shows a top view of part of the surface 208 of the second device 3100. As shown, the constraint 3300 can include an opening 3301 in the surface 208 of the second device 3100. The opening 3301 can comprise a central region 3304 and a plurality of primary slots 3302 that extend in different directions from the central region 3304. The opening 3301 can also include a plurality of side slots 3308 disposed adjacent portions of the primary slots 3302. The side slots 3308 and the primary slots 3302 can comprise portions of the opening 3301 in the surface 208 of the second device 3100. All or parts of the opening 3301—and thus the primary slots 3302 and/or the side slots 3308—can extend partially into or entirely through the second device 3100.

As shown, each of the side slots 3308 can be disposed adjacent a portion of a side wall 3310 of one of the primary slots 3302. A portion of the surface 208 between each of the sidewalls 3310 of the primary slots 3304 and one of the side slots 3308 can be sized to flex and thus be a flexure 3306 that allows the sidewalls 3310 to flex. The thickness of a flexure 3306 (i.e., the width of the portion of the surface 208 between a sidewall 3310 and one of the side slots 3308) can be selected to provide a desired level of flexibility to the flexure 3306. For example, the thickness of a flexure 3306 can be selected such that the flexures 3306 readily flex to receive on oversized, mis-sized, mis-shaped, or mis-positioned alignment feature 3006 as discussed above. It is noted that the side slots 3308 can allow the flexures 3306 to flex or move even if the side slots 3308 do not extend entirely through the second device 3100. The flexures 3306 can be an example of the flexures 3206 of FIG. 32, and the primary slots 3302 can be an example of the slots 3202 of FIG. 32.

Figure 34:
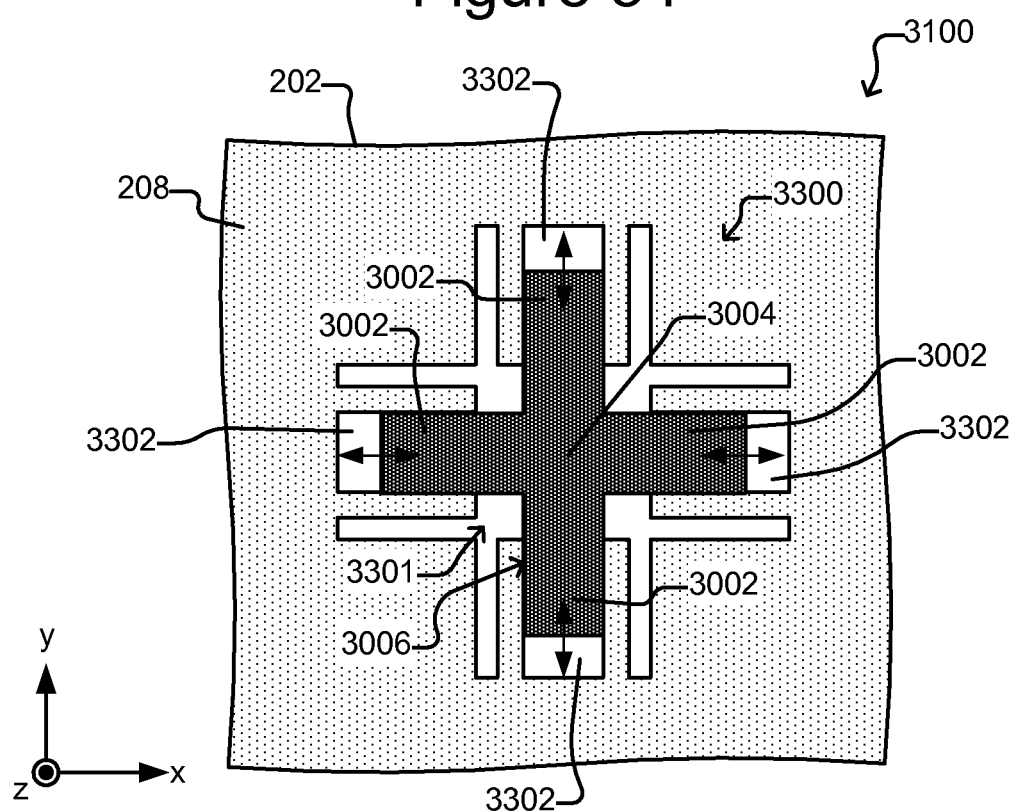
FIG. 34 illustrates the constraint of FIG. 33 with the alignment feature of FIG. 30 inserted into the constraint.

FIG. 34—which depicts the same partial view of the second device 3100 as FIG. 33—shows the alignment feature 3006 in the opening 3301 of the constraint 3300. As discussed above and as illustrated in FIG. 34, the primary slots 3302 of the constraint 3300 can restrict relative thermal movement of the first device 3000 with respect to the second device 3100 to the directions defined by the primary slots 3302. In the example shown in FIG. 34, these can be directions in the "x,y" plane that are radial from the central region 3304 (see FIG. 33) of the opening 3301. As discussed above, however, the primary slots 3302 can be oriented in other directions to achieve other restricted relative thermal movements of the first device 3000 with respect to the second device 3100. For example, such other restricted relative thermal movements can include radial movement from a position other than the central region 3304 (see FIG. 33) of the opening 3301 and can include movements other than radial movements (e.g., movements in a particular direction).

Figure 35:
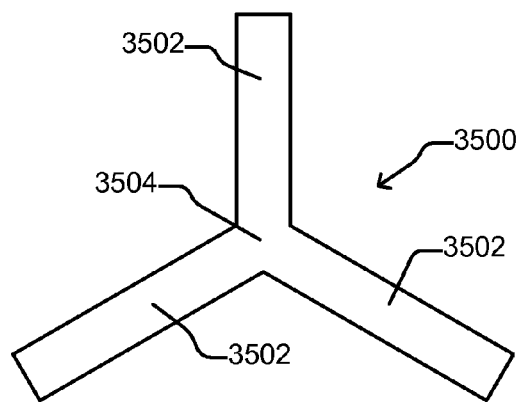
FIGS. 35-37 illustrate examples of shapes of the constraints of FIGS. 31-34.
Figure 36:
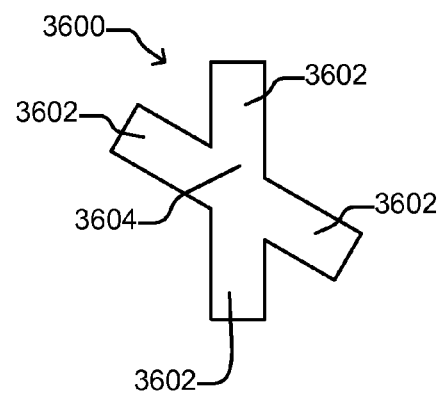
Figure 37:
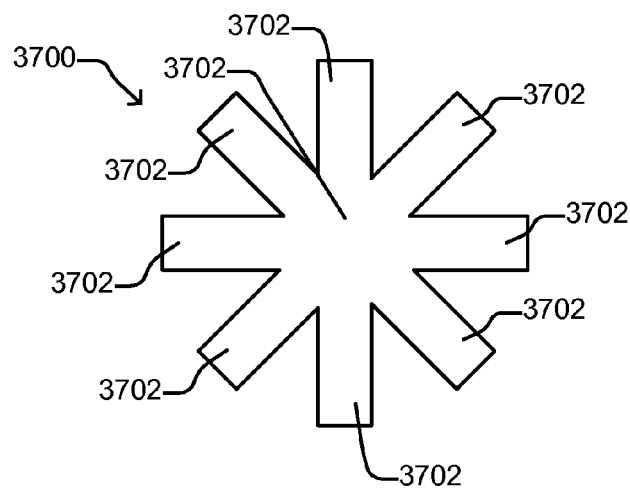

As mentioned, the shape of the alignment feature 3006 and the shape of the corresponding constraint 3106 (including constraint 3300) illustrated in FIGS. 30-34 is an example only, and other shapes are possible. FIGS. 35-37 illustrate non-limiting examples of such other shapes. FIG. 35 illustrates an example of a constraint 3500 in which three slots 3502 extend from a central region 3504. The slots 3502 can be oriented at approximately equal angles from each other or at different angles. FIG. 36 illustrates an example of a constraint 3600 in which a plurality of slots 3602 extend from a central region 3604 to form an "X" shape. FIG. 37 illustrates an example of a constraint 3700 in which multiple slots 3702 extend from a central region 3702. The multiple slots 3702 can be oriented at approximately equal angles from each other or at different angles. The shape of the constraint 3106 (including constraint 3300) can take any of the foregoing shapes as well as other shapes. The shape of the alignment feature 3006 can be generally similar to the shape of the constraint 3106 and thus have a shape that is similar to any of the shapes illustrated in FIGS. 35-37 as well as other shapes. The shapes shown in FIGS. 35-37 are examples only, and other shapes can be used. For example, the slots (e.g., 3502, 3602, or 3702) can be but need not be symmetrically arranged about the central region (e.g., 3504, 3604, or 3704).

Any of the constraints 3500, 3600, and 3700 can replace the constraint 3106 (including constraint 3300) in FIGS. 31-34, and an alignment feature with a generally similar shape can replace the alignment feature 3006 in FIGS. 30 and 32-34. Regardless of the specific shape of the constraint 3106, the constraint 3106 can, generally speaking, comprise a central region (e.g., 3104, 3504, 3604, or 3704) and slots (e.g., 3102, 3502, 3602, or 3702) that can be generally rectangular (including square) and can extend radially from the central region. The shape of the alignment feature 3006 can be similar (e.g., the alignment feature 3006 can, generally speaking, comprise a generally similar central region (e.g., 3004) and generally similar extensions (e.g., 3002) that can be generally rectangular (including square) and can extend radially from the central region.

I claim:

1. An apparatus comprising:
    a first device comprising one or more first elements on a surface of the first device, the first device further comprising alignment features, wherein each said alignment feature extends from the first device; and
    a second device comprising one or more second elements disposed in a pattern that corresponds to the one or more first elements, the second device further comprising constraints disposed in a pattern that corresponds to a pattern of the alignment features, wherein each said constraint comprises an opening into the second device at a surface of the second device into which one of the alignment features is inserted,
    wherein each pair of one of the alignment features inserted into one of the constraints allows relative motion between the first device and the second device in a first direction in a plane parallel to the surface of the second device and restricts relative motion between the first device and the second device in a second direction in the plane.

2. The apparatus of claim 1, wherein the second elements are on a surface of the second device.

3. The apparatus of claim 1, wherein each of the alignment features forms a friction fit with a corresponding one of the constraints.

4. The apparatus of claim 1, wherein each of the alignment features fits into but is oversized with respect to a corresponding one of the constraints.

5. The apparatus of claim 1, wherein:
    the alignment features or the constraints are stiff, and
    the other of the alignment features or the constraints are compliant.

6. The apparatus of claim 1, wherein each said constraint:
    allows lateral movement in a first direction in the plane of the alignment feature inserted into the constraint within the opening of the constrain, and
    restricts lateral movement in a second direction in the plane of the alignment feature inserted into the constraint within the opening of the constraint.

7. The apparatus of claim 1, wherein each said constraint further comprises a slot into the second device and a flexure, wherein the slot is disposed adjacent the opening and the flexure comprises material of the second device between the opening of the constraint and the slot.

8. The apparatus of claim 1, wherein the alignment features inserted into the constraints allow relative radial expansion, in the plane from a point in the plane, of the first device with respect to the second device, and the alignment features inserted into the constraints restrict relative rotation, in the plane about the point, of the first device with respect to the second device.

9. The apparatus of claim 1, wherein the opening of each constraint is elongated at the surface of the second device, and a longest dimension at the surface of the second device of each of the elongated openings is directed at a same location on the surface of the second device.

10. The apparatus of claim 9, wherein the same location on the second device is a centroid of the second elements.

11. The apparatus of claim 9, wherein each of the constraints further comprises flexures disposed adjacent opposite sidewalls of the elongated opening along the longest dimension of the elongated opening.

12. The apparatus of claim 11, wherein each of the constraints further comprises a first slot disposed adjacent a first of the sidewalls and a second slot disposed adjacent a second of the sidewalls, and a first of the flexures comprises material of the first device between the elongated opening and the first slot, and a second of the flexures comprises material of the second device between the elongated opening and the second slot.

13. The apparatus of claim 9, wherein the longest dimension at the surface of the second device of the elongated opening of at least one of the constraints is perpendicular to the longest dimension at the surface of the second device of at least one other of the elongated openings.

14. The apparatus of claim 13, wherein:
    the constraints comprise pairs of constraints in which the longest dimension at the surface of the second device of the opening of each constraint in the pair is disposed along a same axis, and
    for each pair of the constraints along a first axis, there is another pair of the constraints along a second axis that is perpendicular to the first axis.

15. The apparatus of claim 9, wherein:
the apparatus is a probe card assembly,
the first device is a wiring substrate comprising an electrical interface to a tester for controlling testing of electronic devices, and the first elements are electrical terminals electrically connected through the wiring substrate to the interface,
the second device comprises a frame to which is coupled at least one probe substrate with probes for contacting the electronic devices, and electrical connections between the terminals and the at least one probe substrate comprise the second elements.

16. The apparatus of claim 15, wherein:
the second device further comprises an interposer disposed in an opening in the frame and biased against positioning bumps in the opening, and
the second elements comprise electrically conductive spring interconnects of the interposer.

17. The apparatus of claim 9, wherein each of the constraints comprises a plurality of sidewalls and flexures disposed adjacent each of the sidewalls.

18. The apparatus of claim 17, wherein each of the constraints further comprises:
a first slot disposed adjacent a first of the sidewalls of the opening, a second slot disposed adjacent a second of the sidewalls of the opening, a third slot disposed adjacent a third of the sidewalls of the opening, and a fourth slot disposed adjacent a fourth of the sidewalls of the opening; and
a first of the flexures comprises material of the first device between the opening and the first slot, a second of the flexures comprises material of the second device between the opening and the second slot, a third of the flexures comprises material of the second device between the opening and the third slot, and a fourth of the flexures comprises material of the second device between the opening and the fourth slot.

19. The apparatus of claim 1, wherein the second elements are in mechanical communication with the second device.

20. The apparatus of claim 19, wherein:
the second device comprises a frame with an opening in which an interposer is disposed,
the interposer is biased against bumps inside the opening, and
the second elements comprise electrically conductive spring contact elements extending from the interposer.

21. The apparatus of claim 1, wherein the alignment features inserted into the constraints restrict to a predetermined relative motion one of the first device or the second device with respect to the other of the first device or the second device due to thermal expansion or contraction of one of the first device or the second device with respect to the other of the first device or the second device.

22. The apparatus of claim 21, wherein:
the alignment feature comprises a structure that extends from the first device and comprises a central region and at least three extensions that are generally rectangular and extend radially from the central region of the alignment feature; and
the constraint comprises an opening in the second device and comprises a central region and at least three slots that are generally rectangular and extend radially from the central region of the opening.

* * * * *

UNITED STATES PATENT AND TRADEMARK OFFICE
CERTIFICATE OF CORRECTION

PATENT NO. : 8,760,187 B2  
APPLICATION NO. : 12/327576  
DATED : June 24, 2014  
INVENTOR(S) : Eric D. Hobbs Page 1 of 1

It is certified that error appears in the above-identified patent and that said Letters Patent is hereby corrected as shown below:

Title page, item [73], change the Assignee from "L-3 Communications Corp., New York, NY (US)" to:
--FormFactor, Inc., Livermore, CA (US)--

Signed and Sealed this
Eleventh Day of August, 2015

Michelle K. Lee
*Director of the United States Patent and Trademark Office*